(12) United States Patent
Malic et al.

(10) Patent No.: US 11,661,469 B2
(45) Date of Patent: May 30, 2023

(54) POLYMER FILM-METAL COMPOSITES

(71) Applicant: NATIONAL RESEARCH COUNCIL OF CANADA, Ottawa (CA)

(72) Inventors: Lidija Malic, Saint Leonard (CA); Xuefeng Zhang, Boucherville (CA); Keith Morton, St-Bruno-de-Montarville (CA); Teodor Veres, Montreal (CA)

(73) Assignee: National Research Council of Canada, Ottawa (CA)

( * ) Notice: Subject to any disclaimer, the term of this patent is extended or adjusted under 35 U.S.C. 154(b) by 424 days.

(21) Appl. No.: 16/651,018

(22) PCT Filed: Sep. 25, 2018

(86) PCT No.: PCT/CA2018/051203
§ 371 (c)(1),
(2) Date: Mar. 26, 2020

(87) PCT Pub. No.: WO2019/060990
PCT Pub. Date: Apr. 4, 2019

(65) Prior Publication Data
US 2020/0223999 A1 Jul. 16, 2020

Related U.S. Application Data

(60) Provisional application No. 62/563,170, filed on Sep. 26, 2017.

(51) Int. Cl.
C08F 290/06 (2006.01)
C08F 222/10 (2006.01)
(Continued)

(52) U.S. Cl.
CPC ...... *C08F 290/062* (2013.01); *C08F 222/102* (2020.02); *C08J 7/044* (2020.01);
(Continued)

(58) Field of Classification Search
CPC .......................................................... G03F 7/00
See application file for complete search history.

(56) References Cited

U.S. PATENT DOCUMENTS 4,786,837 A 11/1988 Kalnin
2008/0166670 A1 7/2008 Park et al.
(Continued)

FOREIGN PATENT DOCUMENTS

EP 3073321 A1 9/2016
JP 2012129133 A * 7/2012
(Continued)

OTHER PUBLICATIONS

Tenório-Neto et al. ("Synthesis and characterization of silver nanoparticle nanocomposite thin films with thermally induced surface morphology changes", Materials Letters, Nov. 15, 2015, vol. 159, pp. 118-121 ) (Year: 2015).*
(Continued)

*Primary Examiner* — Chanceity N Robinson
(74) *Attorney, Agent, or Firm* — Bereskin & Parr LLP/S.E.N.C.R.L., s.r.l.; Michael Fenwick

(57) ABSTRACT

Disclosed is a method of preparing polymer film-metal composites and uses of such composites. The metal can be in the form of a nanoparticle or a film. The methods comprise depositing on a surface, a composition comprising: a cationic metal precursor; a polymer film precursor that comprises a plurality of photopolymerizable groups; and a photoreducer-photoinitiator; then irradiating the composition under conditions to simultaneously reduce the cationic metal and polymerize the photopolymerizable groups to obtain the composite on the surface.

20 Claims, 21 Drawing Sheets

(51) Int. Cl.

| | |
|---|---|
| C08J 7/18 | (2006.01) |
| C08K 3/08 | (2006.01) |
| G03F 7/004 | (2006.01) |
| G03F 7/027 | (2006.01) |
| G03F 7/028 | (2006.01) |
| C08J 7/044 | (2020.01) |
| B82Y 30/00 | (2011.01) |
| B82Y 40/00 | (2011.01) |
| G03F 7/00 | (2006.01) |

(52) U.S. Cl.
CPC .................. *C08J 7/18* (2013.01); *C08K 3/08* (2013.01); *G03F 7/0043* (2013.01); *G03F 7/028* (2013.01); *G03F 7/0275* (2013.01); *B82Y 30/00* (2013.01); *B82Y 40/00* (2013.01); *C08J 2333/08* (2013.01); *C08K 2003/0831* (2013.01); *C08K 2201/011* (2013.01); *G03F 7/0037* (2013.01)

(56) References Cited

U.S. PATENT DOCUMENTS

2013/0156645 A1* 6/2013 Hong ................... G01N 33/545
422/69
2015/0225532 A1 8/2015 Gerlinger et al.

FOREIGN PATENT DOCUMENTS

| JP | 20121219133 A | 7/2012 | |
| JP | 2013512291 A | 4/2013 | |
| KR | 20170124022 | 11/2017 | |
| WO | WO-2004081072 A2 * | 9/2004 | ............ B82Y 30/00 |
| WO | WO2014139031 | 9/2014 | |
| WO | WO2014149805 | 9/2014 | |
| WO | WO-2016046847 A1 * | 3/2016 | ........... A61K 31/137 |
| WO | WO-2019060989 A1 * | 4/2019 | ............... A61K 9/06 |

OTHER PUBLICATIONS

Gunther et al. ("Introduction of surface-modified Au-nanoparticles into the microflow-through polymerization of styrene" Chemical Engineering Journal, Jan. 16, 2008, p. S126). (Year: 2008).*
European Search Report—EP 18863703.7 dated Apr. 28, 2021.
Supplementary European Search Report—EP 18863703.7 dated Jun. 10, 2021.
Badilescu, Simona et al. Microfluidics-Nano-Integration for Synthesis and Sensing. Polymers. 4:1278-1310, 2012.
Balan, L. et al. Photogenerating Silver Nanoparticles and Polymer Nanocomposites by Direct Activation in the Near Infrared. Journal of Nanomaterials. 2012:1-7, 2011.
Chang, Z. et al. Continuous-microflow synthesis of multiscale materials based on polymer microparticles / inorganic nanoparticles composites. Advanced Research In Physics And Engineering. pp. 135-139, 2010.
Fantino, Erika et al., Additive Manufacturing. 2015.
Fantino, Erika et al. 3D Printed PEG-Based Hybrid Nanocomposites Obtained by Sol-Gel Technique. ACS Appl. Mater. Interafaces. 8(8):5627-33, 2016.
Fantino, Erika et al. 3D Printing of Conductive Complex Structures with In Situ Generation of Silver. Nanoparticles. Advance Materials. 28(19):3712-3717, 2016.
O.M. Folarin, E.R. Sadiku, and A. Maity, "Polymer-noble metal nanocomposites: review" Int. J. Phys. Sci. 2011, 6:21, 4869-4882.
Ghosh, K., and S. N. Maiti. "Mechanical properties of silver-powder-filled polypropylene composites" J. Appl. Polym. Sci. 1996, 60:3, 323-331.
Henriquez, Carmen Mabel Gonzalez et al. In situ silver nanoparticle formation embedded into a photopolymerized hydrogel with biocide properties. J. Nanostruct Chem. 4:119-132, 2014.
Khosla, A., "Nanoparticle-doped electrically-conducting polymers for flexible nanomicro systems" Electrochemical Society Interface 2012, 21:3-4, 67-70.
Kudryashov, M. A., et al., "Morphology of a Silver/Polyacrylonitrile Nanocomposite". Technical Physics, Jan. 1, 2011 (Jan. 1, 2011), vol. 56 (1), pp. 92, ISSN 1063-7842.
RangaReddy, P., K. MohanaRaju, and N. SubbaramiReddy, "A Review on polymer nanocomposites: Monometallic and bimetallic nanoparticles for biomedical, optical and engineering applications" 2013, Chem Sci Rev Lett 1:4, 228-235.
Swanminathan Iyer, et al., "Reversible submergence of nanoparticles into ultrathin block copolymer films". Soft Matter, Jan. 1, 2011 (Jan. 1, 2011), vol. 7(6), pp. 2538, ISSN 1744-683X.
Tenorio-Neto, E. T., et al., "Synthesis and characterization of silver nanoparticle nanocomposite thin films with thermally induced surface morphology". Materials Letters, Nov. 15, 2015 (Nov. 15, 2015), vol. 159, pp. 118-121.
Tyagi, M., Suri, G., Chhabra, P., Seshadri, G., Malik, A., Aggarwal, S., and Khandal, R. K. "Novel way of making high refractive index plastics; metal containing polymers for optical applications" e-Polymers 2009, 9:1, 1197-1214.
Veiga, Ana Salome et al. Antimicrobial Hydrogels for the Treatment of Infection. Biopolymers. 100(6):637-644, 2013.
Yagci, Y., M. Sangermano, and G. Rizza, "Synthesis and characterization of gold-epoxy nanocomposites by visible light photoinduced electron transfer and cationic polymerization processes." Macromolecules 2008, 41:20, 7268-7270.
Yagci, Y., M. Sangermano, and G. Rizza, "In situ synthesis of gold-cross-linked poly(ethylene glycol) nanocomposites by photoinduced electron transfer and free radical polymerization processes." Chem. Commun. 2008, 2771-2773.
Zang, Limin. Preparation and application of conducting polymer/Ag/clay composite nanoparticles formed by in situ UV-induced dispersion polymerization. Scientific Reports. 6:20470, 1-12 2016.
English Translation of Japanese Office Action dated Oct. 14, 2022.

* cited by examiner

POLYMER FILM-METAL COMPOSITES

CROSS-REFERENCE TO RELATED APPLICATIONS

The present application is a national phase entry of PCT/CA2018/051203 filed Sep. 25, 2018, which claims the benefit of priority from co-pending U.S. Provisional Application No. 62/563,170 filed on Sep. 26, 2017, the contents of which are incorporated herein by reference in their entirety.

FIELD

The present application relates to polymer film-metal composites, to methods of preparing polymer film-metal composites and to uses of such composites. The metal can be in the form of a nanoparticle or a film.

BACKGROUND

Metallic nanoparticles exhibit advantageous geometry and size-related properties that differ significantly from those observed in the corresponding bulk materials. Their incorporation in polymer matrices including thermoplastics (such as but not limited to polystyrene, polycarbonate, poly(methyl methacrylate) (PMMA) and polydimethylsiloxane (PDMS)) thermosets (such as but not limited to epoxy resins, polyimides and polyesters) or UV curable resists or materials may, for example, lead to nanocomposites with desirable electrical, optical, chemical, magnetic, dielectric and/or mechanical properties, compared to their microparticle-reinforced counterparts. While not wishing to be limited by theory, this is mostly due to high surface-area to volume ratios of homogeneous nanoparticle dispersions in the polymer matrix. However, achieving a homogeneous and uniform dispersion of nanoparticles or having nanoparticles of a particular geometry dispersed within the pre-polymer matrix can be challenging.

Several methods have been used to fabricate metal-polymer nanocomposites, including the vapor phase deposition of metallic particles onto polymer matrices and reducing metal ions in polymer gels and homogenizing polymer and nanosized metal powders [1,2]. Typically, this entails multistep methods as the polymerization of organic monomer and the formation of nanosized metal particles are performed separately, so that the metal particles in the polymer matrix are not homo-dispersed [1]. For instance, metallic nanoparticles of particular size and shape can be synthetized first using well-known batch chemical methods. These particles can then be dispersed into a polymerizable formulation using physical methods including ultrasonic agitation, shear mixing or ball milling [3]. The mixed pre-polymer matrix is finally polymerized in order to obtain the final polymer film with embedded nanoparticles.

Following the polymerization reaction using such techniques, the nanoparticle distribution within the resulting polymer films would be random. In other words, for the fabrication of nanocomposite materials, spatial positioning of the nanoparticles, including but not limited to distribution across the matrix and/or a thin layer of nanoparticles or a continuous metallic film due to percolation of nanoparticles may not be achieved using such techniques.

Composites containing noble metal particles are interesting, for example, due to their advantageous optical properties which arise from their ability to support surface plasmons whose frequency depends on the material, size, shape, and/or the surrounding environment of the nanoparticle. Of these, polymer films containing gold nanoparticles may be of particular interest due to potential applications in flexible sensors and energy storage [3]. For these applications, precise control of particle size, shape and/or dispersion within the polymer matrix may be desirable, for example, as small changes of the configuration of the composite such as the total metal content as well as the size and/or the shape of the nanoparticles can lead to dramatic changes in the electrical and optical properties of the material [4]. However, gold nanoparticles possess high surface free energy and are thus prone to agglomeration.

As noted above, control of nanoparticle dispersion within the polymer matrix using traditional ex-situ or in-situ physical methods for pre-polymer matrix preparation is complex and challenging, limiting its interest for practical applications. In addition, volume mixing of pre-synthesized particles with a polymer matrix has not led to spatially localized (in 2D or 3D) distributions of nanoparticles nor continuous metallic layers inside a polymer matrix.

An in-situ simultaneous polymerization-reduction approach to synthesis of polymer-metal nanocomposites has been reported wherein the polymerization of the organic monomer is carried out in parallel with the formation of the metal nanoparticles [5]. For example, the review article by RangaReddy et al. discloses that metal particles can be generated inside a polymer matrix by decomposition (e.g., thermolysis, photolysis, radiolysis, etc.) or chemical reduction of a metallic precursor dissolved into the polymer [5]. Yagci et al. have shown UV induced radical polymerization of an acrylic resin (poly(ethylene glycol diacrylate, PEGDA) and an epoxy resin (1,3-bis(3,4-epoxycyclohexylethyl)tetramethyldisiloxane, EPDX) and gold nanoparticle formation by the reduction of gold (III) chloride hydrate ($HAuCl_4$) in the presence of a photoinitiator (Irgacure™ 2959 or camphorquinone, respectively) [6,7]. Yagci et al. stated that nanoparticle size depended on the concentration of the gold precursor in the pre-polymer mix, however due to particle agglomeration even at very low precursor concentrations (1%, 3% and 5% wt), the process suffered from poor control of the gold nanoparticles distribution in the polymer matrix in addition to having polydisperse particle size [6]. The distribution and orientation of the larger gold nanoparticles was also random.

SUMMARY

The methods of the present application were used to prepare both plasmonic and conductive metal structures in situ in polymer materials. Polymer-metal composite films were obtained using a wide concentration range of nanoparticle loading, well controlled nanoparticle distribution in the polymer matrix and long-term thermodynamic stability. Examples were observed wherein the geometry and/or the orientation of large metallic particle growth was controlled as a result of smaller particle migration through the polymer network by structuration of the polymer films. The methods can be used to fabricate embedded metallic films in the form of metallic traces, metallic shells, or metallic stacks embedded on the coating and inside a hollow cavity, for example on the top, bottom, or the side-walls of fluidic channels, chambers or reservoirs. The formation of the polymer-metal composite films can be obtained on various solid surfaces, independent of the components, shapes and/or microstructures of the substrates.

Accordingly, the present application includes a method for preparing a polymer film-metal composite, the method comprising:
  depositing on a surface, a composition comprising:
    a cationic metal precursor;
    a polymer film precursor that comprises a plurality of photopolymerizable groups; and
    a photoreducer-photoinitiator; and
  irradiating the composition under conditions to simultaneously reduce the cationic metal and polymerize the photopolymerizable groups to obtain the polymer film-metal composite on the surface.

The present application also includes a polymer film-metal nanoparticle composite comprising a uniform distribution of metal nanoparticles embedded in a polymeric resin film, the polymeric resin comprising a plurality of metal-anchoring groups, the metal anchoring groups anchored to the nanoparticles; a polymer film-metal nanoparticle composite comprising an ordered distribution of metal nanoparticles embedded in a polymeric resin film; and a polymer film-metal film composite comprising a continuous film of the metal embedded in a polymeric resin film.

The present application also includes uses of the polymer film-metal nanoparticle and film composites of the application.

Other features and advantages of the present application will become apparent from the following detailed description. It should be understood, however, that the detailed description and the specific examples while indicating embodiments of the application are given by way of illustration only, since various changes and modifications within the spirit and scope of the application will become apparent to those skilled in the art from this detailed description.

BRIEF DESCRIPTION OF THE DRAWINGS

The present application will now be described in greater detail with reference to the drawings in which.

DETAILED DESCRIPTION

I. Definitions

Figure 1:
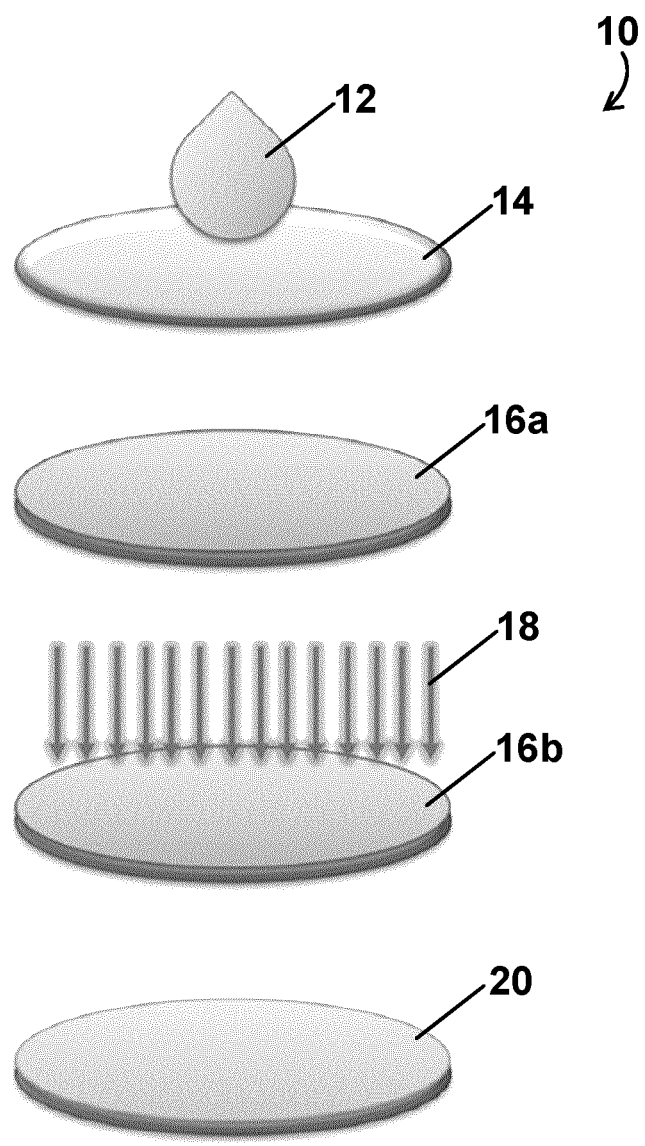
FIG. 1 is a schematic of an embodiment of a method for preparing a polymer film-metal composite of the present application comprising flood exposure of a precursor composition thereto on a surface.

Unless otherwise indicated, the definitions and embodiments described in this and other sections are intended to be applicable to all embodiments and aspects of the present application herein described for which they are suitable as would be understood by a person skilled in the art.

In understanding the scope of the present application, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. The term "consisting" and its derivatives, as used herein, are intended to be closed terms that specify the presence of the stated features, elements, components, groups, integers, and/or steps, but exclude the presence of other unstated features, elements, components, groups, integers and/or steps. The term "consisting essentially of", as used herein, is intended to specify the presence of the stated features, elements, components, groups, integers, and/or steps as well as those that do not materially affect the basic and novel characteristic(s) of features, elements, components, groups, integers, and/or steps.

Terms of degree such as "substantially", "about" and "approximately" as used herein mean a reasonable amount of deviation of the modified term such that the end result is not significantly changed. These terms of degree should be construed as including a deviation of at least ±5% of the modified term if this deviation would not negate the meaning of the word it modifies.

The term "and/or" as used herein means that the listed items are present, or used, individually or in combination. In effect, this term means that "at least one of" or "one or more" of the listed items is used or present.

As used in this application, the singular forms "a", "an" and "the" include plural references unless the content clearly dictates otherwise. For example, an embodiment including "a polymer film precursor" should be understood to present certain aspects with one polymer film precursor or two or more additional polymer film precursors. In embodiments comprising an "additional" or "second" component, such as an additional or second polymer film precursor, the second component as used herein is chemically different from the other components or first component. A "third" component is different from the other, first, and second components, and further enumerated or "additional" components are similarly different.

In embodiments of the present application, the compounds described herein have at least one asymmetric center. Where compounds possess more than one asymmetric center, they may exist as diastereomers. It is to be further understood that while the stereochemistry of the compounds may be as shown in any given compound listed herein, such compounds may also contain certain amounts (e.g. less than 20%, optionally less than 10%, optionally less than 5%, optionally less than 1%) of compounds having alternate stereochemistry.

The term "suitable" as used herein means that the selection of specific reagents or conditions will depend on the reaction being performed and the desired results, but nonetheless, can generally be made by a person skilled in the art once all relevant information is known.

The term "dithiothreitol" and the abbreviation "DTT" refer to a compound having the following structure:

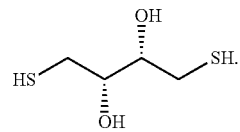

The term "poly(ethylene glycol)-diacrylate" and the abbreviation "PEGDA" as used herein refer to a monomer having the following structure:

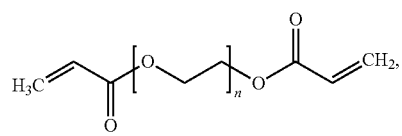

wherein n is dependent on the molecular weight of the PEGDA. For example, commercial sources of PEGDA include those available from Aldrich having an average $M_n$ of about 200, 575 and 700.

The term "ethoxylated trimethylolpropane triacrylate" and the abbreviation "ETPTA" as used herein refer to a monomer having the following structure:

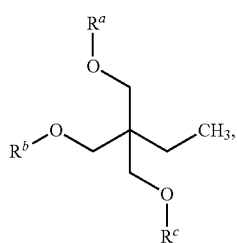

wherein $R^a$, $R^b$ and $R^c$ have the structure:

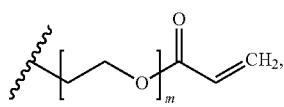

wherein each m may be the same or different and is dependent on the molecular weight of the ETPTA. For example, commercial sources of ETPTA include those available from Aldrich having an average $M_n$ of about 428, 692 and 912 as well as those available from Sartomer having a molecular weight of 428 g/mol (SR-454), 693 g/mol (SR-502) and 956 g/mol (SR-9035).

The term "metal-anchoring group" as used herein refers to a functional group capable of bonding to a surface of a metal e.g. a metal nanoparticle.

The term "cationic metal precursor" as used herein refers to a compound in which the metal exists in cationic form and is reduced under the conditions used for photopolymerization in the methods for preparing a polymer film-metal composite of the present application.

II. Methods

The methods of the present application were used to prepare both plasmonic and conductive metal structures in situ in polymer materials. Polymer-metal composite films were obtained using a wide concentration range of nanoparticle loading, well controlled nanoparticle distribution in the polymer matrix and long-term thermodynamic stability. Examples were observed wherein the geometry and/or the orientation of large metallic particle growth was controlled as a result of smaller particle migration through the polymer network by structuration of the polymer films. The methods can be used to fabricate embedded metallic films in form of metallic traces, metallic shells, or metallic stacks embedded on the coating and inside a hollow cavity, for example on the top, bottom, or the side-walls of fluidic channels, chambers or reservoirs. The formation of the polymer-metal composite films can be obtained on various solid surfaces, independent of the components, shapes and/or microstructures of the substrates.

Accordingly, the present application includes a method for preparing a polymer film-metal composite, the method comprising:
  depositing on a surface, a composition comprising:
    a cationic metal precursor;
    a polymer film precursor that comprises a plurality of photopolymerizable groups; and
    a photoreducer-photoinitiator; and
  irradiating the composition under conditions to simultaneously reduce the cationic metal and polymerize the photopolymerizable groups to obtain the polymer film-metal composite on the surface.

The surface is any suitable surface. In some embodiments, the surface comprises a polymer, a glass, a silicon wafer or a paper. In an embodiment, the polymer is polycarbonate (PC), polystyrene (PS), poly(methyl methacrylate) (PMMA), polyethylene terephthalate (PET) or a cyclo-olefin polymer such as Zeonor™. In some embodiments, the surface is the inside of a hollow cavity. In another embodiment, the hollow cavity is a microchannel, a microchamber or a microreservoir. In a further embodiment, the hollow cavity is a microchannel.

The conditions for irradiation can be any suitable conditions. In some embodiments, the irradiating comprises flood exposure of the composition deposited on the surface. An exemplary schematic of such an embodiment 10 of the method for preparing a polymer film-metal composite of the present application is shown in FIG. 1. Referring to FIG. 1, in the exemplified embodiment 10, the composition 12 is deposited on the surface 14 such that a layer 16a of the composition is deposited. Then, the layer 16b of the composition is irradiated via flood exposure 18 to simultaneously reduce the cationic metal and polymerize the photopolymerizable groups to obtain the polymer film-metal composite 20.

Figure 2:
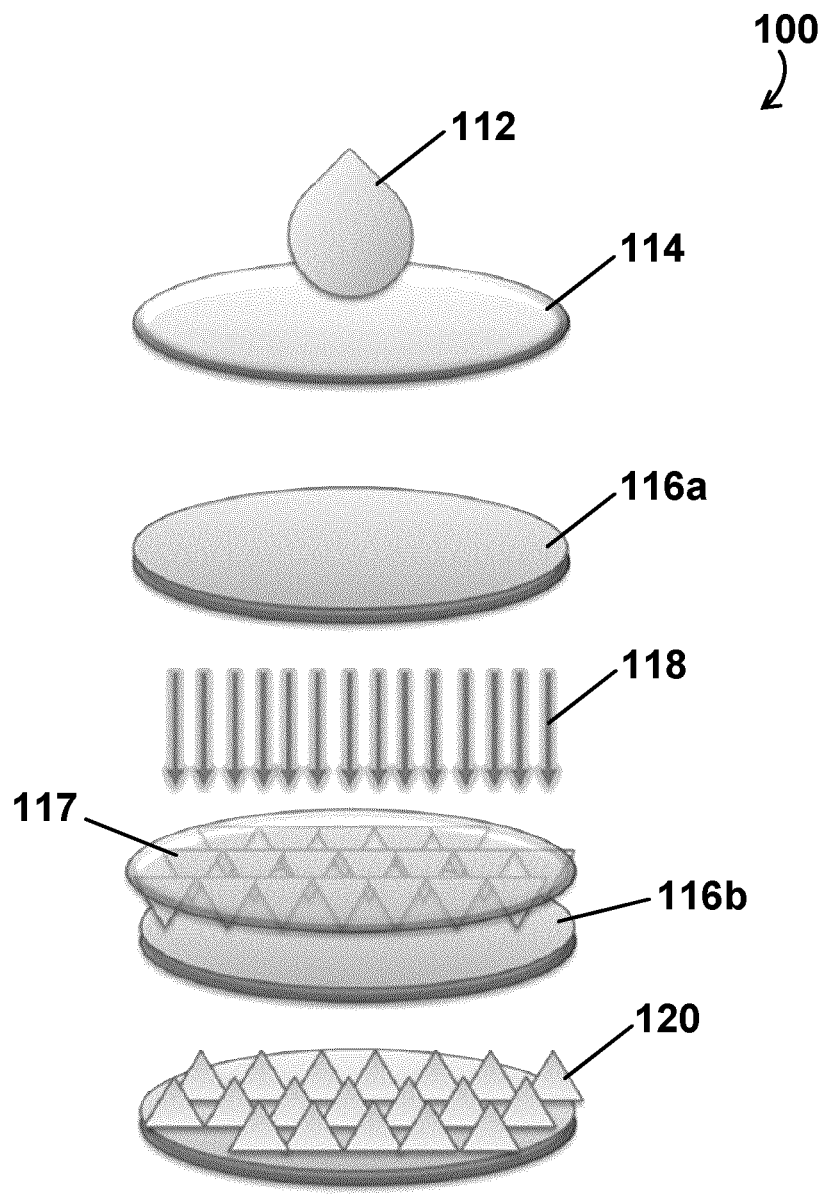
FIG. 2 is a schematic of an embodiment of a method for preparing a polymer film-metal composite of the present application comprising flood exposure of a precursor composition thereto on a surface through a topographically structured template comprising micro- or nanostructures that are replicated as a negative on a surface of the composite film.

The conditions for irradiation may also comprise a suitable nanoimprint lithography technique. Accordingly, in some embodiments wherein the irradiating comprises flood exposure of the composition deposited on the surface, the surface is imprinted with a pattern. An exemplary schematic of such an embodiment 100 of the method for preparing a polymer film-metal composite of the present application is shown in FIG. 2. Referring to FIG. 2, in the exemplified embodiment 100, the composition 112 is deposited on the surface 114 such that a layer 116a of the composition is deposited. Then, the layer 116b of the composition is imprinted with a pattern via template 117 while being irradiated via flood exposure 118 to simultaneously reduce the cationic metal and polymerize the photopolymerizable groups to obtain the polymer film-metal composite 120. Alternatively, in some embodiments (not shown in FIG. 2), the composition is first deposited in a template, then covered by the surface (thereby depositing the composition on the surface) and subsequently irradiated. It will be appreciated by a person skilled in the art that in such embodiments, the composite has the negative of the surface pattern imprinted thereon. Accordingly, in some embodiments, the pattern is imprinted on the surface via a template having a desired pattern. The template can be any suitable template. For example, it will be appreciated by a person skilled in the art that the template is formed of a material that is transparent to the irradiation (i.e. it allows the transmission of the irradiation through the template such that the irradiation is capable of initiation of the reduction/polymerization of the composite precursors). In an embodiment, the template is a polymeric working stamp. In another embodiment, the template comprises a cyclo-olefin polymer (e.g. Zeonex™) or a polydimethylsiloxane. Templates and methods for preparing such templates having a desired pattern are known and can be selected by a person skilled in the art. In an embodiment, the template comprises features that are in the microscale (i.e. from about 1 μm to less than 1,000 μm), features that are in the nanoscale (i.e. from about 1 nm to less than 1,000 nm) or combinations thereof. In an embodiment, the features are microscale features. In another embodiment, the features are nanoscale features. In a further embodiment, the features are a combination of microscale features and nanoscale features.

In an embodiment, the features are circular. In another embodiment, the features are lines. In an embodiment, the lines are arranged in a grating. In another embodiment, the grating is from about 500 nm to about 900 nm or about 700 nm. In some embodiments of the present application, the method further comprises removing the template from the composite. In some embodiments, the method further comprises removing the composite from the surface to obtain a composite that has the negative of the surface pattern templated thereon. It will be appreciated by a person skilled in the art that in such embodiments, the material forming the template and/or the surface is selected such that it allows the release of the composite.

Figure 3:
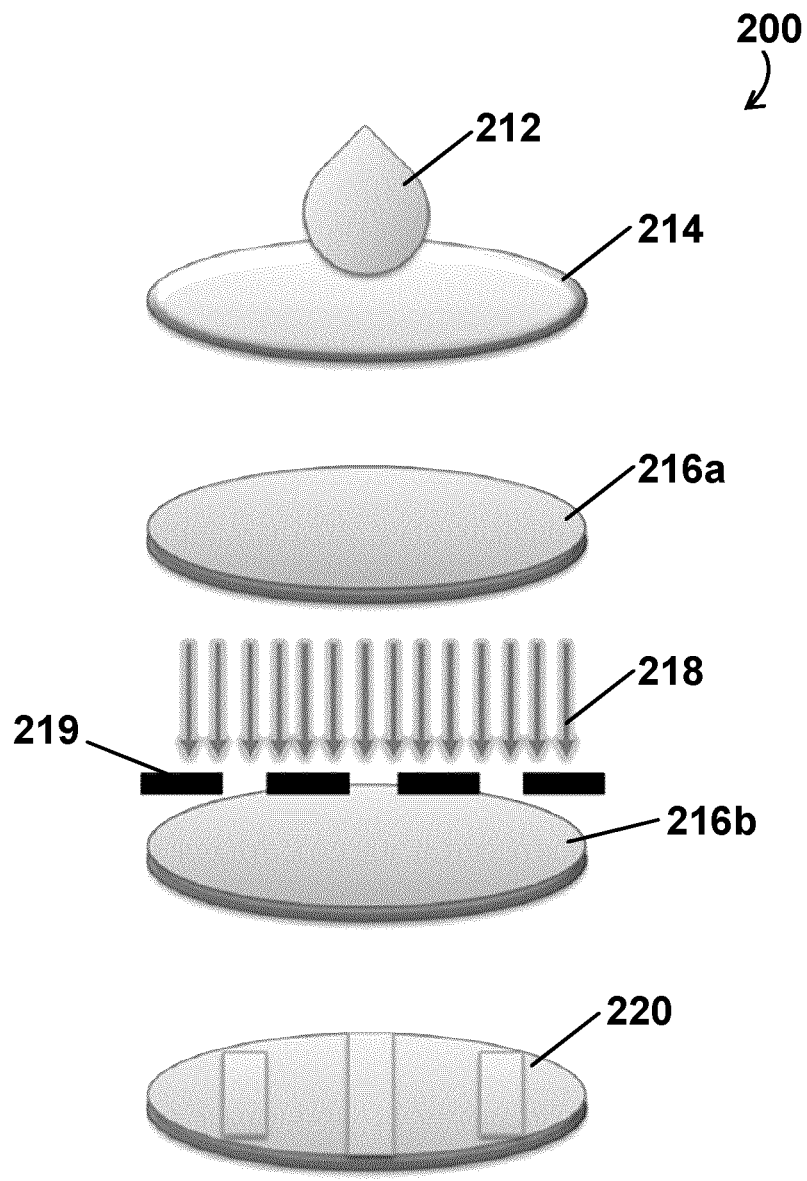
FIG. 3 is a schematic of an embodiment of a method for preparing a polymer film-metal composite of the present application comprising photolithography, with the precursor composition to the composite being irradiated through a mask defining a desired pattern.

Alternatively, the conditions for irradiation may comprise a suitable photolithographic technique. Accordingly, in some embodiments, the irradiating comprises exposure of the composition deposited on the surface through a mask defining a pattern. An exemplary schematic of such an embodiment 200 of the method for preparing a polymer film-metal composite of the present application is shown in FIG. 3. Referring to FIG. 3, in the exemplified embodiment 200, the composition 212 is deposited on the surface 214 such that a layer 216a of the composition is deposited. Then, the layer 216b of the composition is irradiated 218 through a mask defining a pattern 219 to simultaneously reduce the cationic metal and polymerize the photopolymerizable groups to obtain the polymer film-metal composite 220. It will be appreciated by a person skilled in the art that in such embodiments, those portions of the layer 216b of the composition which are not exposed to the irradiation through the pattern defined in the mask 219 do not undergo reduction/polymerization to form a composite. Accordingly, in some embodiments, the method further comprises removing the unexposed composition under conditions to leave the composite on the surface. This method can be used, for example, to define a conductive trace on a substrate.

The composition can be deposited on the surface by any suitable means. In some embodiments, prior to irradiating, the method further comprises subjecting the composition deposited on the surface to a further means for obtaining a uniform film. Such means are known and can be selected by a person skilled in the art. In an embodiment, the composition deposited on the surface is subjected to spin-coating or doctor blading to obtain a uniform film.

Figure 4:
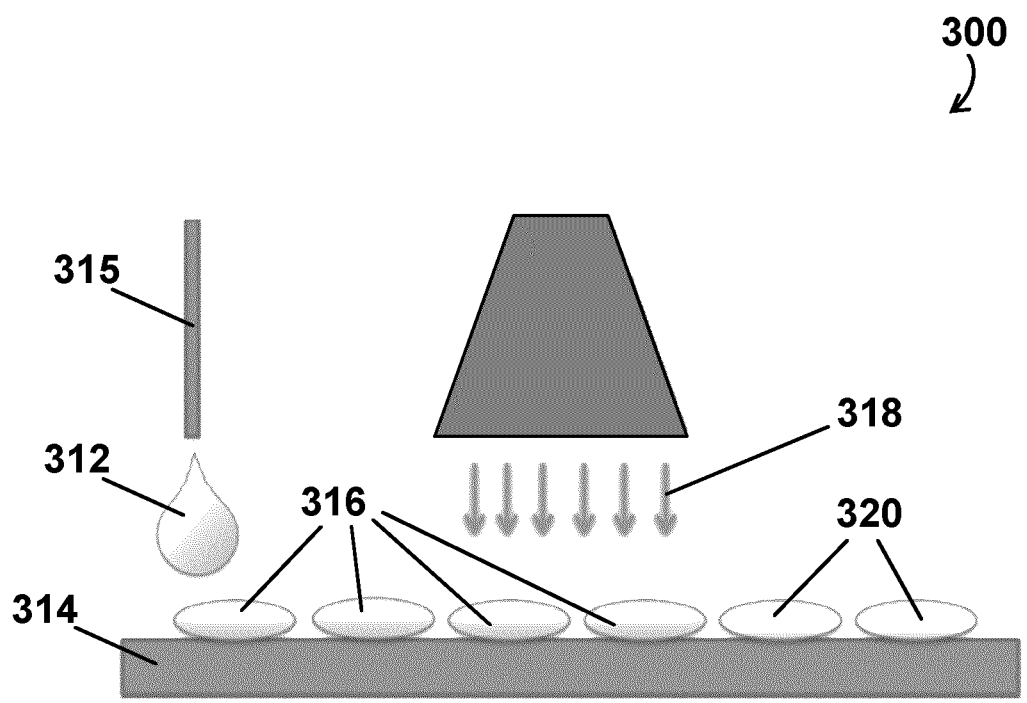
FIG. 4 is a schematic of an embodiment of a method for preparing a polymer film-metal composite of the present application comprising a large-scale fabrication technique such as roll-to-roll processing.

Alternatively, in some embodiments, the composition is deposited on the surface via inkjet printing, screen printing, stamping (e.g. using a patterned elastomeric substrate), fluidic deposition, capillary deposition or by doctor blading. Such methods for deposition may be used, for example, for large-scale substrate fabrication. Accordingly, in some embodiments, the method comprises roll-to-roll processing. An exemplary schematic of such an embodiment 300 of the method for preparing a polymer film-metal composite of the present application that comprises a method for large-scale processing such as wafer-scale processing or roll-to-roll processing is shown in FIG. 4. Referring to FIG. 4, in the exemplified embodiment 300, droplets 312 of the composition are deposited on the surface 314 using a suitable means 315 such as an inkjet printer. Then, the droplets deposited on the surface 316 are irradiated 318 to simultaneously reduce the cationic metal and polymerize the photopolymerizable groups to obtain the polymer film-metal composite 320.

In an embodiment, the cationic metal precursor is present in an amount of from about 0.1% wt to about 50% wt, based on the total weight of the composition.

Some embodiments of the methods of the present application may be used to prepare polymer film-metal composites wherein the metal is in the form of nanoparticles. Alternatively, some embodiments of the methods of the present application may be used to prepare polymer film-metal composites wherein the metal is in the form of a semi-continuous or continuous film.

The range of concentrations for cationic metal precursors (e.g. the cationic gold metal precursor) that was used to obtain a continuous film was from 100 to 500 mg/mL. Accordingly, in an embodiment of the present application, the concentration of the cationic metal precursor in the composition is about 100 mg/mL to about 500 mg/mL. In another embodiment, the conditions comprise irradiating the composition at an exposure dose to obtain a continuous film of the metal embedded in the polymer film. It will be appreciated by a person skilled in the art that as the concentration of metal is increased, the exposure dose used also increases. In some embodiments, the conditions comprise irradiating the composition for a time of about 10 seconds to about 10 minutes at an intensity of about 14,000 mW/cm$^2$ to obtain the continuous film of the metal embedded in the polymer film. In some embodiments, the conditions comprise irradiating the composition at an exposure dose of from about 100 J/cm$^2$ to about 10,000 J/cm$^2$ obtain the continuous film of the metal embedded in the polymer film.

The range of concentrations for cationic metal precursors (e.g. the cationic gold precursor) that was used to obtain metal nanoparticles was from 1 to 500 mg/mL, with preferred concentrations from 10 mg/mL to 100 mg/mL. Accordingly, in an embodiment, the concentration of the cationic metal precursor in the composition is about 1 mg/mL to about 500 mg/mL. In another embodiment, the concentration of the cationic metal precursor in the composition is about 10 mg/mL to about 100 mg/mL. In another embodiment, the conditions comprise irradiating the composition at an exposure dose to obtain metal nanoparticles embedded in the polymer film. It will be appreciated by a person skilled in the art that as the concentration of metal is increased, the exposure dose used (which depends on both time and lamp intensity) also increases. In some embodiments, the exposure dose is from about 0.1 J/cm$^2$ to about 50 J/cm$^2$.

In some embodiments, the composition further comprises an agent that caps and/or stabilizes the nanoparticles. The term "caps" as used herein in reference to an agent that caps nanoparticles refers to an agent that may inhibit and/or prevent the nanoparticles from growth. The term "stabilizes" as used herein in reference to an agent that stabilizes nanoparticles refers to an agent that may inhibit and/or prevent the nanoparticles from agglomeration. In an embodiment, the agent that caps and/or stabilizes the nanoparticles is a polymer or a surfactant. Suitable polymers and surfactants for capping and/or stabilizing nanoparticles are known and can be selected by a person skilled in the art. In an embodiment, the agent that caps and/or stabilizes the nanoparticles is polyethyleneimine or polyvinyl alcohol. In another embodiment of the present application, the agent that caps and/or stabilizes the nanoparticles surfactant is oleylamine.

In the studies described hereinbelow, a uniform gold nanoparticle distribution within the polymer film was observed when the polymer film precursor was prepared by a method comprising reacting the monomer poly(ethylene glycol)-diacrylate (PEGDA) with the metal-anchoring group dithiothreitol (DTT) to obtain the corresponding polymer film precursor. A uniform metal nanoparticle distribution may also be obtained when the polymer film precursor comprises other metal-anchoring groups. Accordingly, in some embodiments, the polymer film precursor further comprises a plurality of metal-anchoring groups. The metal-anchoring groups can be any suitable metal-anchoring groups. In an embodiment, the metal anchoring groups are thiols, primary amines, silanes or combinations thereof. In another embodiment, the metal anchoring groups are thiols.

In an embodiment, the nanoparticles have an average diameter of from about 20 nm to about 120 nm.

The cationic metal precursor can be any suitable cationic metal precursor. In an embodiment of the present application, the cationic metal precursor is a cationic gold precursor, a cationic silver precursor, a cationic copper precursor or combinations thereof. In a further embodiment, the cationic metal precursor is a cationic gold precursor. In another embodiment, the cationic gold precursor is a gold chloride. In another embodiment, the cationic metal precursor is a cationic silver precursor. In a further embodiment, the cationic silver precursor is $AgNO_3$. In another embodiment, the cationic metal precursor is a cationic copper precursor. In a further embodiment, the cationic copper precursor is copper sulfate. In another embodiment, the cationic metal precursor is a gold chloride, silver nitrate, copper sulfate or combinations thereof. In another embodiment, the gold chloride is $HAuCl_4$.

The photopolymerizable groups can be any suitable photopolymerizable groups. In an embodiment, the photopolymerizable groups are selected from acrylate groups, epoxy groups, cyclic siloxane groups or a combination thereof. The cyclic siloxane group is any suitable cyclic siloxane group that undergoes ring-opening polymerization under the conditions used for photopolymerization in the methods for preparing a polymer film-metal composite of the present application. In another embodiment, the cyclic siloxane groups have a ring size of 6, 8 or 10. In a further embodiment, the cyclic siloxane group is a cyclic dimethylsiloxane group. In another embodiment, the photopolymerizable groups are acrylate groups.

In an embodiment, the polymer film precursor is obtained from a method comprising:

reacting a monomer comprising two or more photopolymerizable groups with an anchor precursor comprising at least one metal-anchoring group and at least one group that will react with the photopolymerizable group.

In an embodiment, an aqueous solution of the monomer is reacted with an aqueous solution of the anchor precursor.

In an embodiment, the at least one metal-anchoring group and the at least one group that will react with the photopolymerizable group are the same and the anchor precursor is a bi-functional thiol, bi-functional primary amine or bi-functional silane. In an embodiment, the anchor precursor is dithiothreitol.

In an embodiment, the monomer further comprises an oligomeric poly(ethylene glycol). In another embodiment, the monomer is poly(ethylene glycol)-diacrylate (PEGDA) or ethoxylated trimethylolpropane triacrylate (ETPTA). In a further embodiment, the monomer is poly(ethylene glycol)-diacrylate (PEGDA). In another embodiment, the monomer is ethoxylated trimethylolpropane triacrylate (ETPTA). The molecular weight of the PEGDA and the ETPTA is any suitable molecular weight and can be selected by the person skilled in the art. In an embodiment, the average $M_n$ of the PEGDA is from about 200 to about 700. In another embodiment, the average $M_n$ of the PEGDA is about 200, about 575 or about 700. In a further embodiment, the average $M_n$ of the ETPTA is from about 428 to about 956. In another embodiment of the present application, the average $M_n$ of the ETPTA is about 428, about 693, about 912 or about 956.

In an embodiment, the molar ratio of the monomer to the anchor precursor is from about 10:1 to about 1:1. In another embodiment, the molar ratio of the monomer to the anchor precursor is about 10:1.

The photoreducer-photoinitiator is any suitable photoreducer-photoinitiator that is capable of photoreducing the cationic metal precursor and photoinitiating the polymerization of the photopolymerizable groups in the polymer film precursor under the conditions used in the methods of the present application. In an embodiment, the photoreducer-photoinitiator is 2-hydroxy-2-methyl-1-phenyl-propan-1-one (Darocure™ 1173) or 2-hydroxy-4'-(2-hydroxyethoxy)-2-methylpropiophenone (Irgacure™ 2959). In another embodiment, the photoreducer-photoinitiator is 2-hydroxy-2-methyl-1-phenyl-propan-1-one. In a further embodiment, the photoreducer-photoinitiator is 2-hydroxy-4'-(2-hydroxyethoxy)-2-methylpropiophenone.

The wavelength of irradiation may depend, for example, on the selection of the photoreducer-photoinitiator and a suitable wavelength for a particular photoreducer-photoinitiator can be selected by a person skilled in the art. In some embodiments, the composition is irradiated at a wavelength of from about 100 nm to about 400 nm. In another embodiment, the composition is irradiated at a wavelength of from about 350 nm to about 380 nm or about 365 nm. The selection of a suitable source for the electromagnetic radiation for the irradiation can be made by a person skilled in the art.

III. Composites

The present application also includes a polymer film-metal nanoparticle composite comprising a uniform distribution of metal nanoparticles embedded in a polymeric resin film, the polymeric resin comprising a plurality of metal-anchoring groups, the metal anchoring groups anchored to the nanoparticles; a polymer film-metal nanoparticle composite comprising an ordered distribution of metal nanoparticles embedded in a polymeric resin film; and a polymer film-metal film composite comprising a continuous film of the metal embedded in a polymeric resin film. In some embodiments, the composites are prepared by a method for preparing polymer film-metal composites of the present application. Accordingly, the present application also includes a polymer film-metal composite prepared by a method for preparing polymer film-metal composites of the present application. It will be appreciated by a person skilled in the art that embodiments of the composites can be varied as described herein for the methods for preparing the polymer film-metal composites of the present application.

The metal-anchoring groups can be any suitable metal-anchoring groups. In an embodiment, the metal-anchoring groups are derived from bi-functional thiols, bi-functional primary amines or bi-functional silanes (i.e. the metal-anchoring groups are introduced into the polymeric resin by a method comprising the use of an anchor precursor as that term is used herein that is a bi-functional thiol, bi-functional primary amine or bi-functional silane). In another embodiment, the metal anchoring groups are derived from dithiothreitol. In an embodiment of the composite which comprises metal anchoring groups, the molar ratio of the monomers comprised in the polymeric resin to the metal anchoring groups is from about 10:1 to about 1:1. In another embodiment of the composite which comprises metal anchoring groups, the molar ratio is about 10:1.

In an embodiment, the nanoparticles have an average diameter of from about 20 nm to about 120 nm.

In an embodiment of the composite comprising an ordered distribution of metal nanoparticles embedded in a polymeric resin film, the metal nanoparticles are agglomerated into geometrical shapes. In another embodiment of the composite comprising an ordered distribution of metal nanoparticles embedded in a polymeric resin film, the apexes of the geometrical shapes are aligned with nanostructured grating lines. In some embodiments, the geometric shapes have from 3 to 6 sides. In another embodiment of the present application, the geometric shapes are triangles, rectangles, trapezoids, hexagons or combinations thereof.

In some embodiments, the composite is deposited on a surface. In some embodiments, the composite is deposited on the surface in a pattern. Such composites deposited on the surface in a pattern can be prepared, for example, using an embodiment of a method of the present application comprising irradiation of the precursor composition through a mask defining a pattern.

In some embodiments, the composite comprises a surface pattern. Such composites comprising a surface pattern can be prepared, for example, using an embodiment of a method of the present application comprising imprinting the surface with a pattern, for example, using a template with a negative of the pattern.

In an embodiment, the metal is gold, silver, copper or combinations thereof. In another embodiment, the metal is gold. In a further embodiment, the metal is silver. It is an embodiment that the metal is copper. In another embodiment, the metal is a combination of two or more of gold, silver and copper.

The polymeric resin is any suitable polymeric resin. In an embodiment, the polymeric resin is an acrylate resin, an epoxy resin, a siloxane resin or combinations thereof. In an embodiment, the siloxane resin is derived from ring-opening polymerization of a monomer comprising a cyclic siloxane group. In another embodiment, the cyclic siloxane groups have a ring size of 6, 8 or 10. In a further embodiment, the cyclic siloxane group is a cyclic dimethylsiloxane group. In another embodiment, the siloxane resin is derived from an organoreactive siloxane. The term "organoreactive siloxane" as used herein refers to a siloxane resin precursor comprising photopolymerizable groups such as acrylate or epoxy groups. In another embodiment, the polymeric resin is an acrylate resin.

In an embodiment, the polymeric resin further comprises an oligomeric poly(ethylene glycol). In another embodiment, the polymeric resin is a poly(ethylene glycol)-diacrylate (PEGDA) resin or an ethoxylated trimethylolpropane triacrylate (ETPTA) resin. In a further embodiment, the polymeric resin is a PEGDA resin. It is an embodiment that the polymeric resin is an ETPTA resin. The molecular weight of the PEGDA and the ETPTA monomers comprised in the PEGDA and ETPTA resins, respectively is any suitable molecular weight and can be selected by the person skilled in the art. In an embodiment, the average $M_n$ of the PEGDA is from about 200 to about 700. In another embodiment, the average $M_n$ of the PEGDA is about 200, about 575 or about 700. In a further embodiment, the average $M_n$ of the ETPTA is from about 428 to about 956. In another embodiment of the present application, the average $M_n$ of the ETPTA is about 428, about 693, about 912 or about 956.

IV. Uses of Composites

The polymer film-metal nanoparticle and film composites of the application are new therefore the present application includes all uses of the polymer film-metal nanoparticle and film composites of the application.

In some embodiments, the composites are for use in plasmonic sensor substrates, microheaters based on plasmonics, integration in microfluidic devices, electrochemical sensor substrates (such as but not limited to nanostructured 3D-electrodes or 3D-conductive imprinted hydrogel substrates for electrochemical detection of biological targets), large scale fabricated 3D metamaterials, conductive inks for printable electronics, 3D microelectrodes embedded in microchannels of microfluidic devices that can be used as electrochemical sensors (such as but not limited to impedance sensors or flow detectors), conductive 3D scaffolds for cardiac and/or neural tissue engineering, flexible films displaying plasmonic colors for security printing applications, antimicrobial hydrogels (i.e. polymer films loaded with silver nanoparticles) and conductive or flexible sensor films for wearable electronics. The selection of a suitable composite of the present application for a particular use can be made by a person skilled in the art with reference to the disclosure herein.

The following non-limiting examples are illustrative of the present application:

EXAMPLES

Example 1: Room Temperature UV-Assisted Guided Growth of Metallic Nanoparticles in Structured Polymer Films I. General Materials and Methods Monomer was prepared by mixing poly(ethylene glycol)-diacrylate (PEGDA) (MW 700 Da) with photoinitiator 2-hydroxy-2-methyl-1-phenyl-propan-1-one (Darocure 1173) at a concentration of 1% or as specified, followed by addition of gold chloride at a concentration of 100 mg/ml or as specified (0.1% wt to 30% wt). Alternatively, the monomer contained poly(ethylene glycol)-diacrylate (PEGDA) (MW 700 Da) reacted with 200 mg/ml dithiothreitol, DTT (aqueous solution) and mixed with photoinitiator 2-hydroxy-2-methyl-1-phenyl-propan-1-one (Darocure 1173) at a concentration of 1% or as specified, followed by addition of gold chloride at a concentration of 100 mg/ml or as specified (0.1% wt to 30% wt). In further experiments, the monomer was prepared by mixing ethoxylated trimethylolpropane triacrylate (ETPTA) with photoinitiator 2-hydroxy-2-methyl-1-phenyl-propan-1-one (Darocure 1173) at a concentration of 1% or as specified, followed by addition of gold chloride at a concentration of 100 mg/ml or as specified (0.1% wt to 30% wt).

The monomer was deposited on the substrate using spin coating or doctor-blading and UV exposed. The exposure was performed using either standard photolithography (chromium or transparency mask) or nanoimprint lithography (nanostructured or microstructured mold) in order to obtain 2D or 3D structured films. Alternatively, the monomer was flood exposed to obtain a uniform flat film. In other examples, the monomer was co-flowed with an immiscible inner phase through a channel to coat the walls of the channel and exposed in the designated areas in the channel using projection lithography. The exposure dose used varied depending on the application from 0.1 $J/cm^2$ to about 50 $J/cm^2$. In the case of obtaining a continuous gold film, the exposure dose used was up to 4000 $J/cm^2$.

II. Results and Discussion

To the inventors' knowledge, to date there is no reported process able to fabricate polymer embedded patterns (or continuous films) with 2D or 3D localization of metallic nanoparticles that can be produced at room temperature. Accordingly, a method to obtain metal-polymer composite films composed of independent or percolated nanoparticles (i.e. a metallic film) with well controlled particle size and distribution throughout the polymer network that can be, for example, either 2D- or 3D-patterned at room temperature by UV light exposure was investigated. The method may be capable of producing a homogeneous and uniform particle distribution with monodisperse particles throughout the polymer network even at high precursor concentrations, or alternatively, it may be capable of the generation of continuous metallic films. Another object was to study a method to control the geometry and the orientation of large metallic nanoparticle growth as a result of smaller particle migration through the polymer network by structuration (2D- or 3D-patterning) of the fabricated polymer films.

The method relied on UV irradiation of a mixture of a monomer and a metallic precursor. The method used in-situ simultaneous reduction-polymerization of a metal precursor-monomer composition. UV generated radicals initiated the polyaddition reaction of the acrylic resin, and simultaneously reduced the metal (e.g. $Au^{3+}$ in $HAuCl_4$ to $Au^0$), thus forming metal in situ during the polymer network formation. Two monomers were used; poly(ethylene glycol)-diacrylate (PEGDA) and ethoxylated trimethylolpropane triacrylate (ETPTA), both of which undergo polymerization in the presence of a photoinitiator such as 2-hydroxy-2-methyl-1-phenyl-propan-1-one (Darocure™ 1173) or 2-hydroxy-4'-(2-hydroxyethoxy)-2-methylpropiophenone (Irgacure™ 2959), suitable for polymerization via UV exposure at a wavelength of 365 nm. Other photoinitiators could also be employed for exposure in the range of 100 to 400 nm or broader.

In some experiments, the monomer was first reacted with dithiothreitol (DTT) in aqueous solution. Subsequently, the resulting resin (monomer precursor composite) was used to fabricate the various polymer film-metal composites via UV polymerization. PEGDA or ETPTA reacted with DTT creates a polymer network with reactive thiol groups that can then be used to link gold or silver nanoparticles as they are created in the film, preventing their migration and subsequent agglomeration, resulting in monodisperse, uniformly distributed metal-polymer composites. In other words, when the bi-functional cross-linker dithiothreitol was reacted with the acrylic resin monomer prior to irradiation, the approach allowed one arm of the bi-functional cross-linker to become embedded in the polymer network, while the second arm remained free to be linked to the nanoparticles as they were generated in the film.

Figure 5:
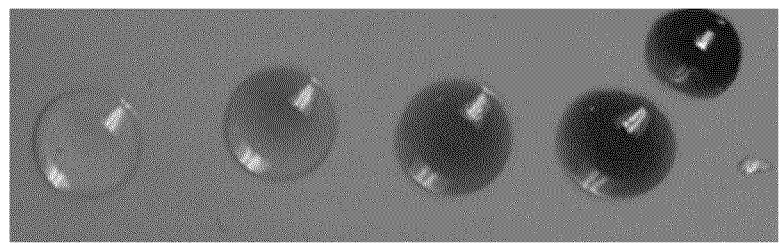
FIG. 5 is a photograph of poly(ethylene glycol)-diacrylate PEGDA polymer film-silver nanoparticle composites according to embodiments of the present application prepared with exposure times of from 5 seconds to 1 minute.

The range of concentrations for cationic metal precursors (e.g. the cationic gold metal precursor) that was used to obtain continuous film was from 100 to 500 mg/mL. While not wishing to be limited by theory, this could possibly be lower if the irradiation time was increased. For a continuous metal film, a high intensity source was used (14,000 mW/cm$^2$), and the irradiation time ranged from 10 seconds to 10 minutes. The range of concentrations for cationic metal precursors (e.g. the cationic gold precursor) that was used to obtain metal nanoparticles was from 1 to 500 mg/mL, with preferred concentrations from 10 mg/mL to 100 mg/mL. As the metal concentration increased, the irradiation time (or exposure dose which depended on both time and lamp intensity) also needed to increase. So as to completely reduce the precursor, the exposure dose ranged from 0.1 J/cm$^2$ to about 50 J/cm$^2$. FIG. 5 is a photograph showing hydrogel films made from PEGDA with embedded silver nanoparticles of various sizes (i.e. at various stages of nucleation) in response to exposure times of between 5 seconds and 1 minute. In a colour photograph, the color of the gels ranges from pale yellow (far left) to dark orange (far right). The size of the nanoparticles was measured to be in the range of 20 nm to 120 nm.

Figure 6:
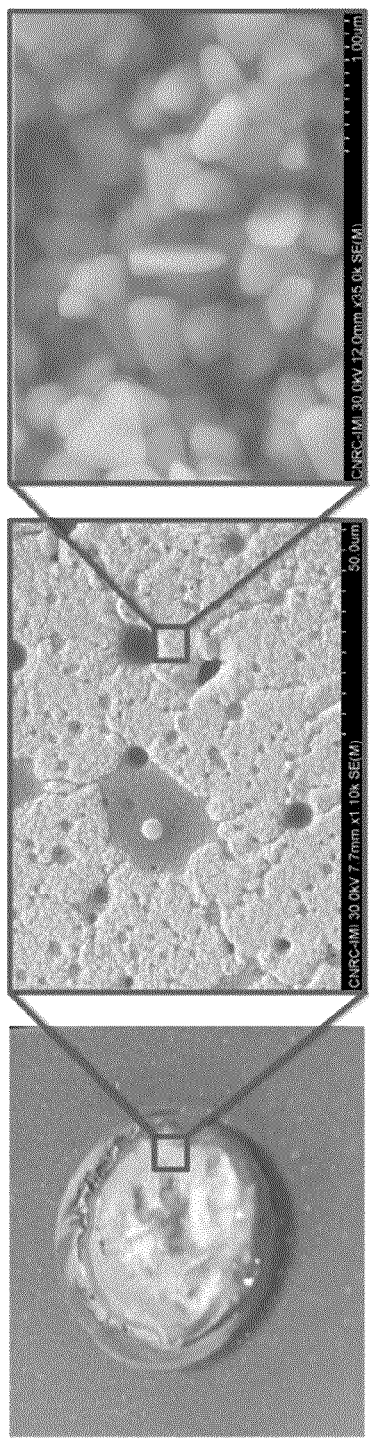
FIG. 6 shows a photograph (left) and scanning electron microscopy (SEM) images (middle and right) at increasing magnification (as indicated by boxes) of conductive continuous gold films fabricated using flood exposure of the precursor composition comprising PEGDA (MW=700 Da) at 10% cationic metal precursor concentration according to an embodiment of a method for preparing a polymer film-metal composite of the present application. Scale bars show 50.0 μm (middle) and 1.00 μm (right).
Figure 7:
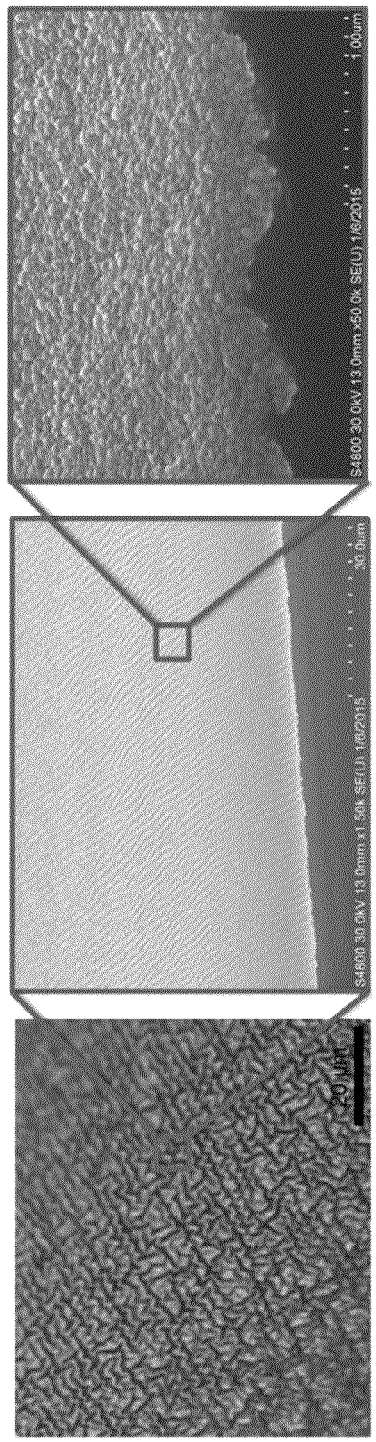
FIG. 7 shows scanning electron microscopy (SEM) images at increasing magnification (as indicated by boxes) of conductive continuous silver films fabricated using flood exposure of the precursor composition comprising PEGDA (MW=700 Da) at 10% cationic metal precursor concentration according to an embodiment of a method for preparing a polymer film-metal composite of the present application. Scale bars show 20 μm (left), 30.0 μm (middle) and 1.00 μm (right).

In some experiments, the precursor composition comprising the desired monomer and cationic metal precursor was used to fabricate composite films via flood exposure of the whole film. In the absence of a bi-functional cross-linker, a longer exposure dose imparts additional energy to the metallic nanoparticles, allowing faster movement through the polymer matrix. For high enough precursor concentrations, this allowed generation of a continuous fully conductive metallic film, as demonstrated by the gold and silver films in FIG. 6 and FIG. 7, respectively which were prepared using 10% of the cationic metal precursor concentration for the respective metals (i.e. $HAlCl_3$ and $AgNO_3$) and the monomer in the precursor composition was PEGDA (MW=700 Da).

Figure 8:
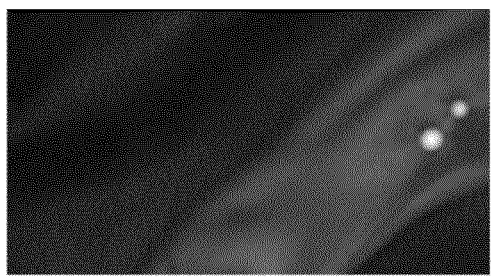
FIG. 8 shows photographs of polymer film (PEGDA; MW=700 Da)-gold nanoparticle composites prepared with varying concentrations of cationic gold metal precursor and thus different nanoparticle sizes according to embodiments of the method for preparing a polymer film-metal composite of the present application. In color photographs, different colors of polymer film-gold nanoparticle composites are observed that depend on the gold particle size as a plasmonic signature.
Figure 8:
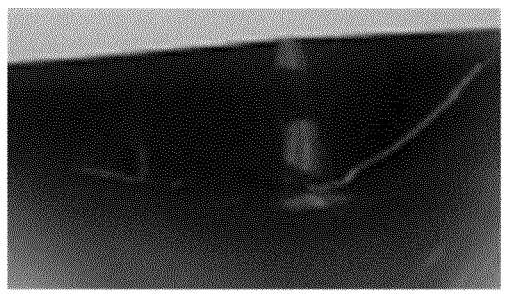
Figure 8:
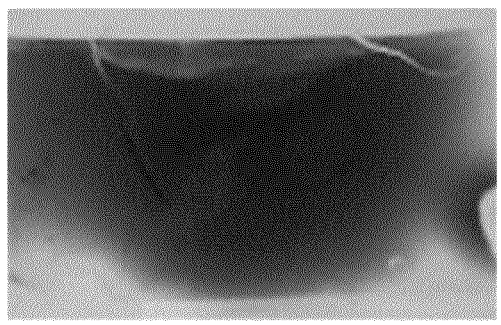
Figure 8:
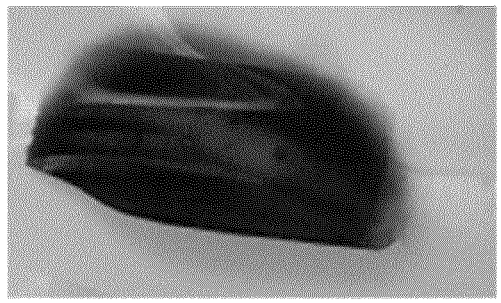

At lower concentrations of cationic metal precursors, conductive films displaying specific plasmonic signatures were obtained (FIG. 8; monomer=PEGDA, MW=700 Da). Different colors of polymer-metal composite films were prepared, depending on the gold particle size as a plasmonic signature. At different precursor concentrations, different nanoparticle sizes were obtained as displayed by the different colors of the resulting film, from purple (left film in color photograph) to dark red (middle images in color photograph) to brownish (right image in color photograph). The concentrations used were: 10, 50, and 100 mg/mL (corresponding to images starting from the second from left). The corresponding mean nanoparticle size was 50, 80 and 100 nm. At higher precursor concentrations, a higher density of nanoparticles was also obtained.

Figure 9:
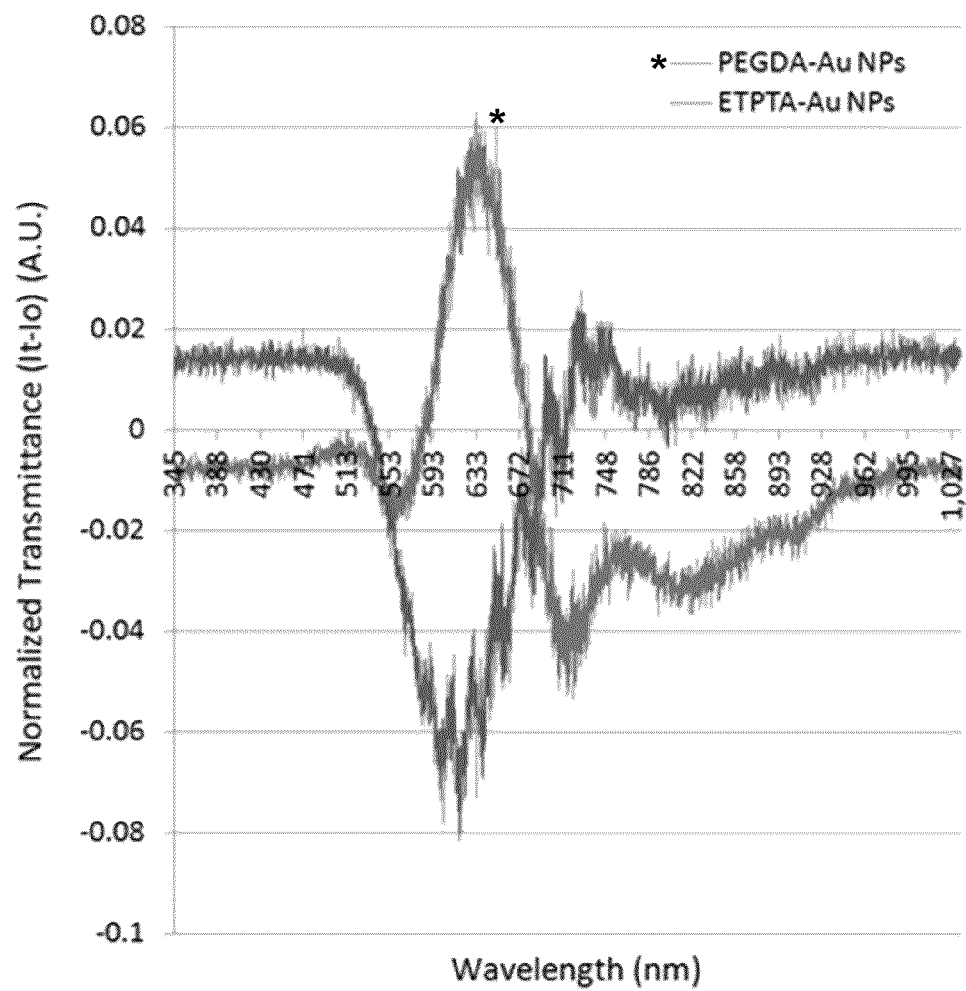
FIG. 9 is a plot comparing the absorbance measurements of composites of the present application prepared from PEGDA versus ethoxylated trimethylolpropane triacrylate (ETPTA) prepared according to an embodiment of a method for preparing a polymer film-metal composite of the present application comprising flood exposure of the precursor composition at 10% cationic metal precursor concentration under conditions to form gold nanoparticles.
Figure 10:
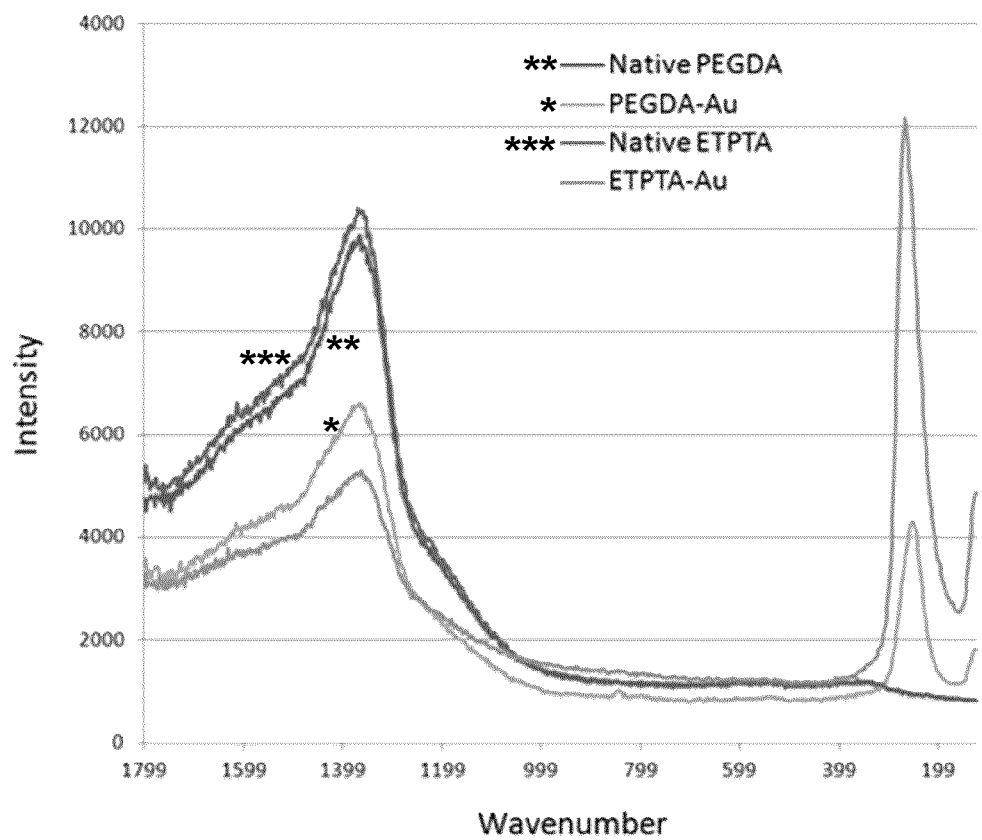
FIG. 10 shows Raman measurements of native polymer films compared to polymer film-gold nanoparticle composites prepared using PEGDA and ETPTA monomers according to methods of the present application, showing distinct peaks at low wavenumbers due to gold nanoparticles.

Absorbance measurements of native polymer films and polymer-metal composites showed that transmitted intensity was blue-shifted for the films with a smaller nanoparticle size, while it was red-shifted for larger nanoparticle sizes. For example, in FIG. 9, it can be seen that transmitted intensity was blue-shifted for the PEGDA-Au nanoparticle film, while it was red-shifted for the ETPTA-Au nanoparticle film which is consistent with the size of the nanoparticle clusters which were larger for the ETPTA films. Raman spectroscopy measurements (FIG. 10) showed distinctive peaks at low wavenumbers for PEGDA- and ETPTA-based composite samples containing gold nanoparticles, a feature that may, for example, be useful for sensor applications.

Figure 11:
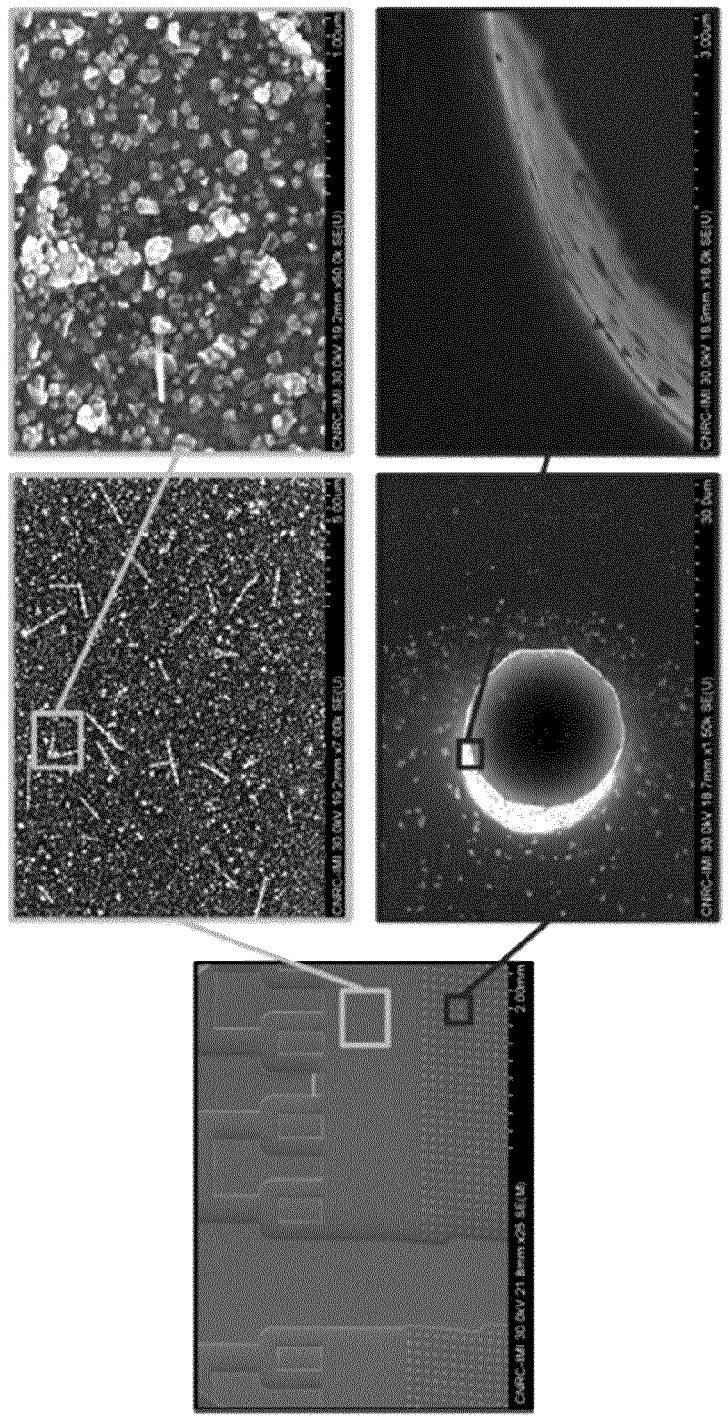
FIG. 11 shows an SEM image of a polymer film-metal nanoparticle composite prepared according to an embodiment of a method for preparing a polymer film-metal composite of the present application comprising imprint lithography (left) and SEM images at successive magnifications (middle and right images) of features in the image at the left, as indicated by boxes. Scale bars show 2.00 mm (left); 5.00 μm (top middle), 1.00 μm (top right), 30.0 μm (bottom middle) and 3.00 μm (bottom right).
Figure 12:
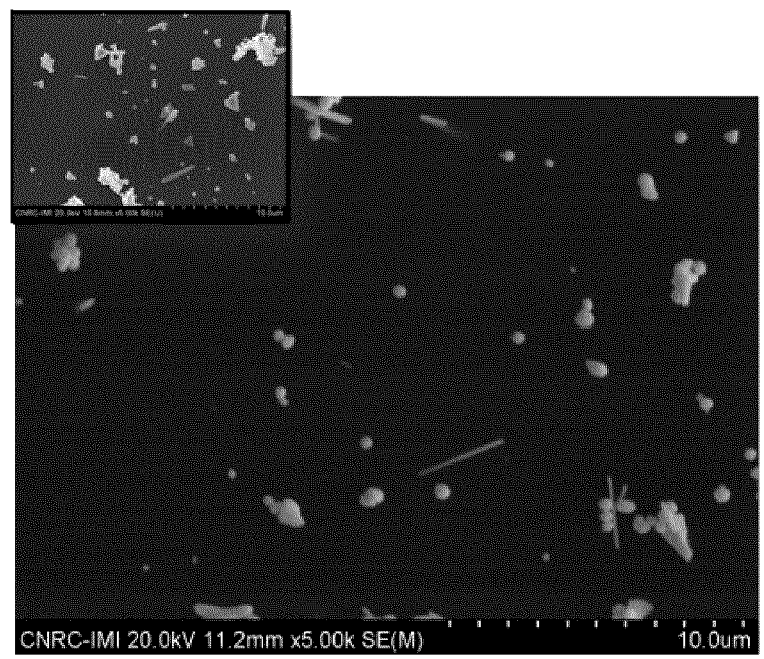
FIG. 12 shows SEM images comparing polymer film-metal composites according to embodiments of the methods of present disclosure using an imprint lithography method with a flat mold (top) and a nanostructured mold containing 700 nm line gratings (bottom). The nanostructures guided the metallic nanoparticles' nucleation and agglomeration which occurred along the grating lines. Nanoparticles agglomerated in regular polygonal geometrical shapes (bottom images), as opposed to random nanoparticle distribution and shape on a flat substrate (top images). Scale bars show 10.0 μm (top images; both main and inset), 200 μm (bottom main image) and 20.0 μm (top left inset of bottom images).
Figure 12:
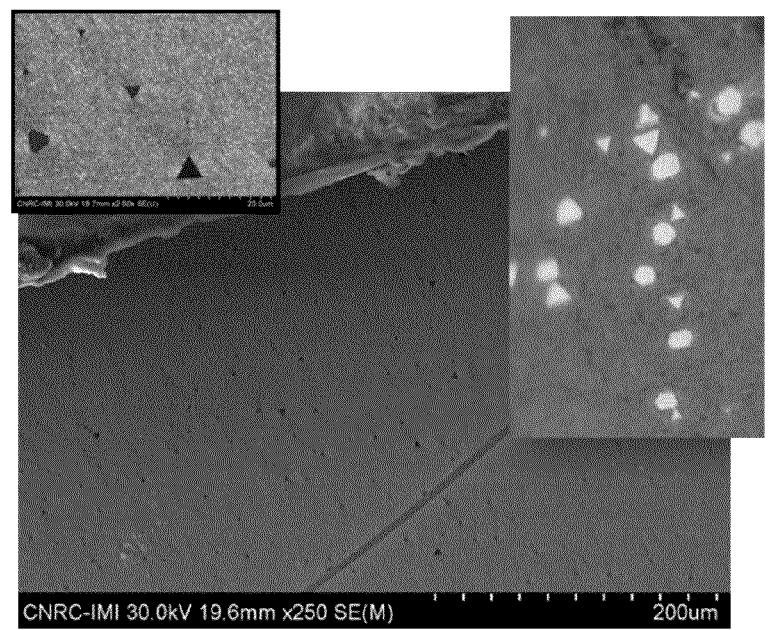
Figure 13:
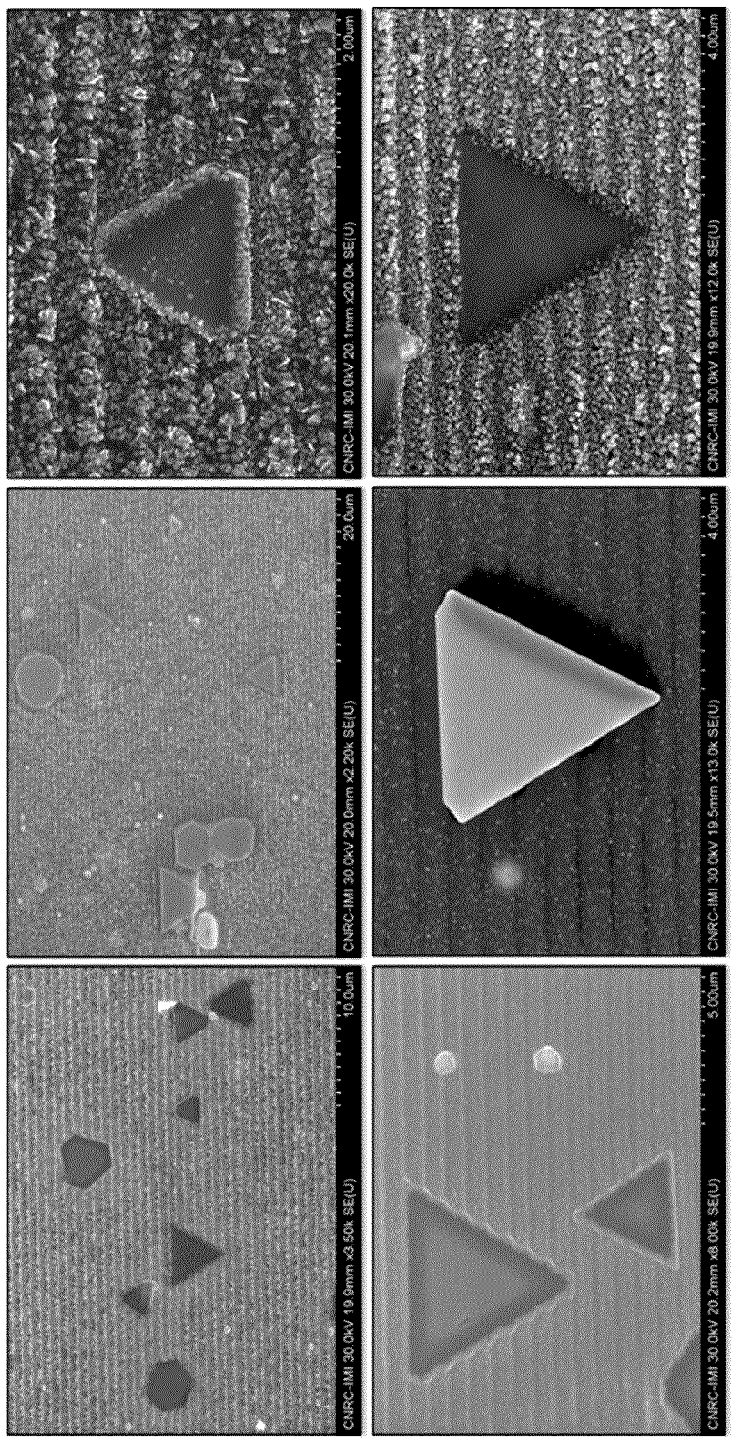
FIG. 13 shows SEM images of guided nucleation, growth and agglomeration of metallic nanoparticles into regular geometrical shapes with apexes aligned with nanostructured grating lines prepared according to embodiments of a method for preparing a polymer film-metal composite of the present application using a nanostructured template. Scale bars on top row show 10.0 μm (left), 20.0 μm (middle) and 2.0 μm (right). Scale bars on bottom row show 5.0 μm (left), 4.0 μm (middle) and 4.0 μm (right).

In some experiments, an imprint lithography method was used. In such experiments, the composite precursor composition was deposited on a structured mold comprising the desired structures, covered by a substrate then irradiated. Alternatively, the structured mold could be placed on top of a composition deposited on a flat surface. After the film was crosslinked, the substrate was peeled off from the mold (demolded) which contained the structured polymer film-metal nanoparticle composite that was a perfect replica of the mold. FIG. 11 (left) shows a microstructured polymer-metal composite containing embedded metallic gold nanoparticles which was fabricated using the imprint lithography method. The microstructuration allows guiding of metallic nanoparticle nucleation and agglomeration around fabricated microstructures. For example, in FIG. 11, it can be observed that the nanoparticles are distributed in a circular pattern around fabricated microstructures (posts; middle and right bottom images) while in the absence of microstructures, the nanoparticles are uniformly distributed on a flat region of the substrate (middle and right top images). A guided growth of particles of a specific geometrical shape can also be achieved using a nanostructured mold. FIG. 12 shows a comparison of fabricated polymer film-metal composites using a flat mold (top images) and a nanostructured mold (bottom images). In FIG. 12, it can be observed that the flat template resulted in randomly distributed particle shapes and orientations, while the nanostructured substrate with 700 nm grating lines resulted in particles that had a polygonal shape with their apexes aligned along the grating line. At high cationic metal precursor concentrations (10% and more), this guided growth and agglomeration became particularly apparent, as can be seen in FIG. 13 in which the concentration was 200 mg/mL.

Figure 14:
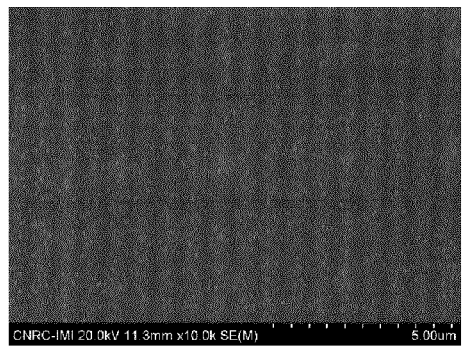
FIG. 14 shows SEM images of a uniform distribution of gold nanoparticles along the grating lines prepared according to embodiments of a method for preparing a polymer film-metal composite of the present application which use a precursor composite containing dithiothreitol (DTT) with nanoparticle size depending on the cationic metal precursor concentration 1% wt (top image), 5% wt (middle image) and 10% wt (bottom image) following irradiation.
Figure 14:
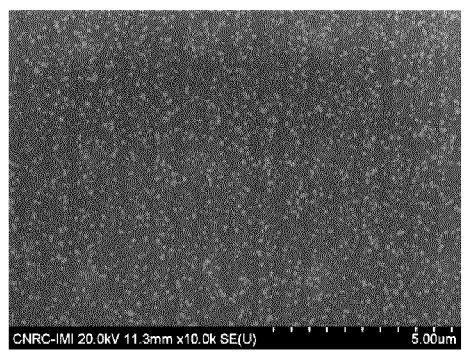
Figure 14:
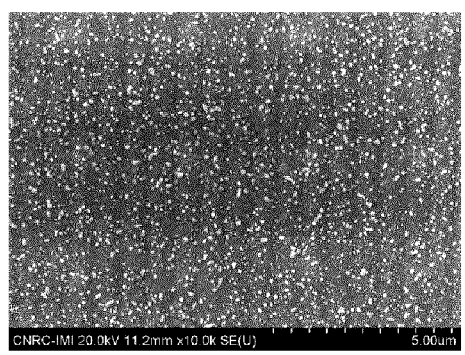

In order to obtain uniformly distributed nanoparticles in the nanostructured polymer film, DTT was used. As explained hereinabove, the DTT prevents nanoparticle agglomeration into larger structures (FIG. 14). As can be seen in FIG. 14, monodispersed particles were uniformly distributed everywhere in the resulting film, with the particle size dependent on the initial precursor concentration as well as the corresponding exposure dose. In the films shown in FIG. 14, the concentrations were, from top to bottom: 10, 50 and 100 mg/mL with an exposure dose of 4.2 $J/cm^2$. Such films comprising nanoparticles were observed to have long-term thermodynamic stability. This was investigated using SEM to image nanoparticle distribution within the polymer matrix. Samples were imaged at 24 hours, 48 hours, one week and one month after synthesis. No significant difference was observed; the nanoparticle size and distribution within the polymer matrix remained stable. Given that the gold nanoparticles possess high surface free energy, agglomeration (and thus increase of the size in the resultant nanoparticles) would have been observable after 24 hours in systems without the DTT anchor.

Figure 15:
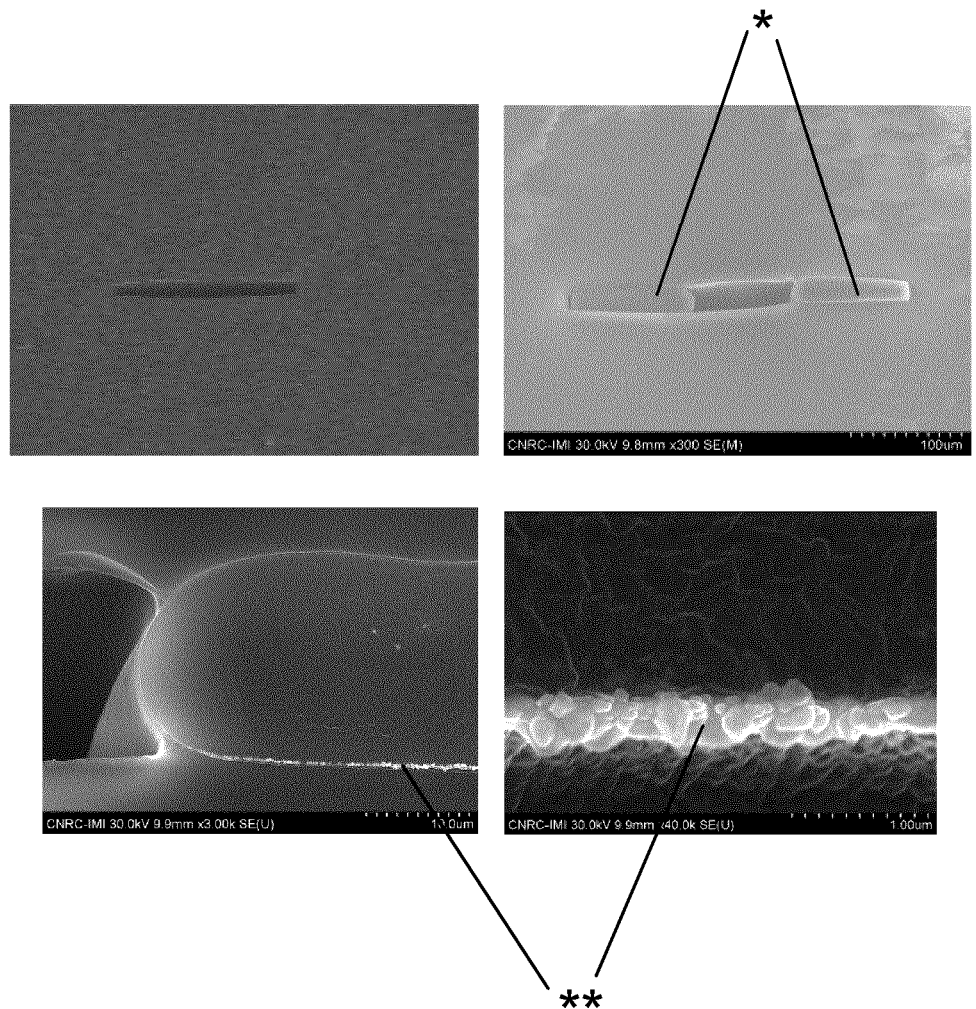
FIG. 15 shows SEM images of the fabrication of conductive traces within a microfluidics device according to an embodiment of the methods of the present disclosure by co-flowing the precursor composition and an immiscible liquid and irradiating: empty channel (top left); channel containing polymer-metal composite (*) (top right); and successive magnifications of the composite film showing conductive trace (electrode (**); bottom images). Scale bars show: 100 μm (top right), 10.0 μm (bottom left) and 1.00 μm (bottom right).

In some experiments, the resin was flowed through a microchannel in a microfluidics device using, for example, flow focusing, by flowing the resin in the outer part of the microchannel and an immiscible liquid, such as oil in the inner part of the microchannel, and exposing using a UV point source to define a polymer-metal composite with conductive traces (electrodes) at a specific location within the microchannel, such as those shown in FIG. 15. Alternatively, exposing through a mask instead of using a UV point source could be used. Such methods may be useful, for example, for the preparation of in-cavity conductive surfaces for embedded sensors and electrodes.

Figure 16:
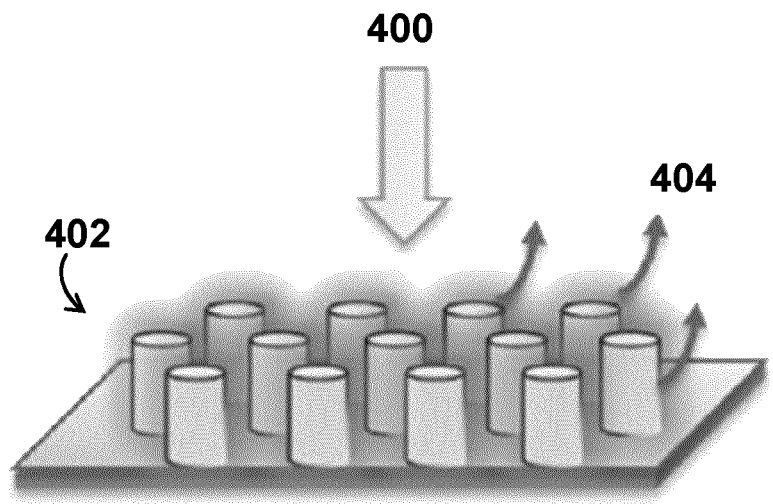
FIG. 16 is a schematic showing an example of light irradiation of an exemplary array of pillars causing localized heating.
Figure 17:
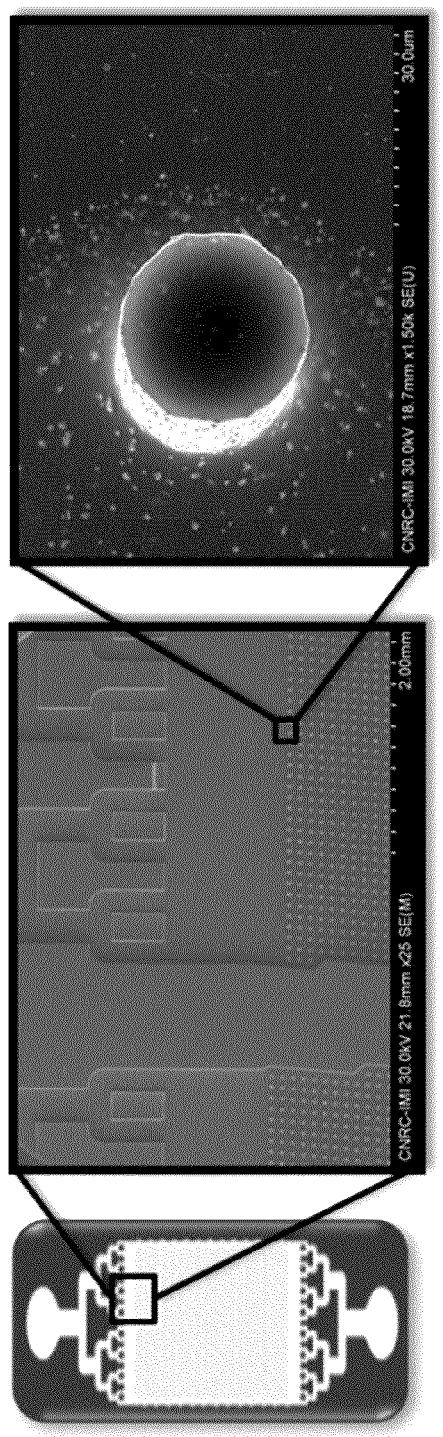
FIG. 17 shows an example of a microfluidic plasmonic microheater device (left) with SEM images at successive magnifications (middle and right images) of features in the image at the left, as indicated by boxes. Scale bars show 2.00 mm (middle) and 30.0 μm (right).
Figure 18:
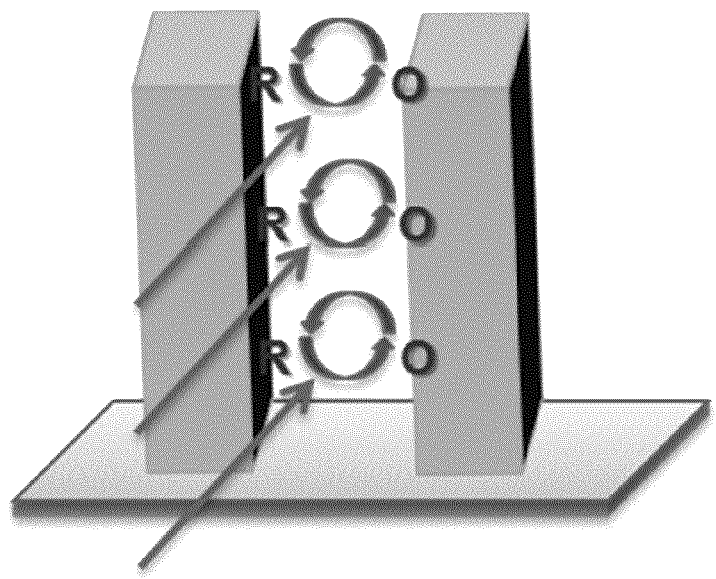
FIG. 18 is a schematic showing an example of a 3D comb electrodes system wherein reduction (R) and oxidation (O) are occurring.
Figure 19:
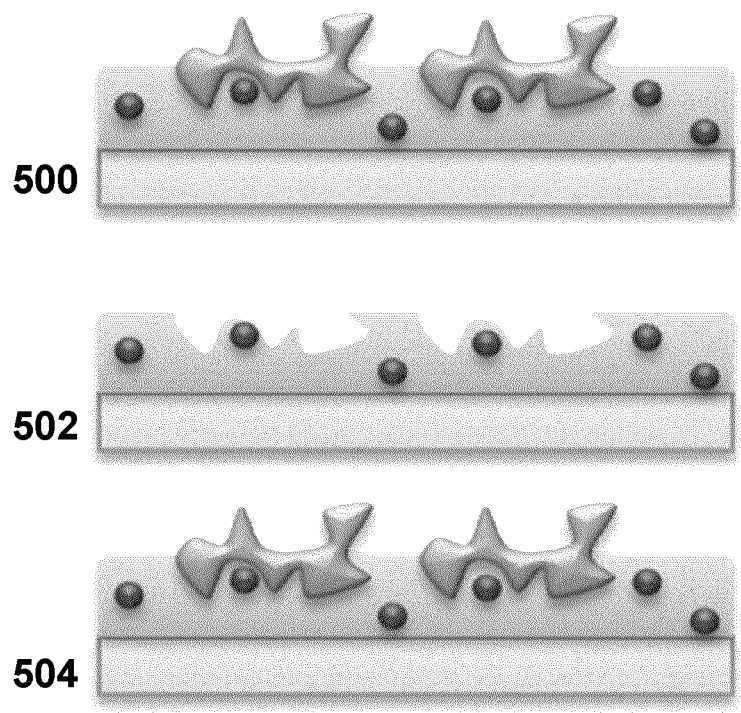
FIG. 19 is a schematic showing an example of the preparation of a molecularly imprinted polymer (MIP) electrochemical sensor film.
Figure 20:
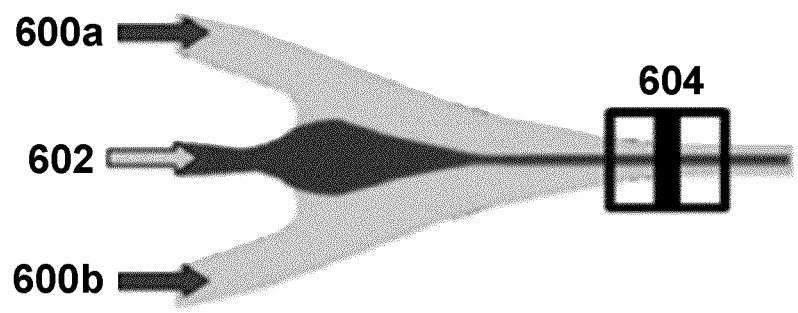
FIG. 20 is a schematic showing an example of a method for preparing a polymer film-metal composite of the present application wherein the surface is a microchannel of a microfluidics device and a mask is applied during irradiation of the composition to selectively pattern an electrode.
Figure 21:
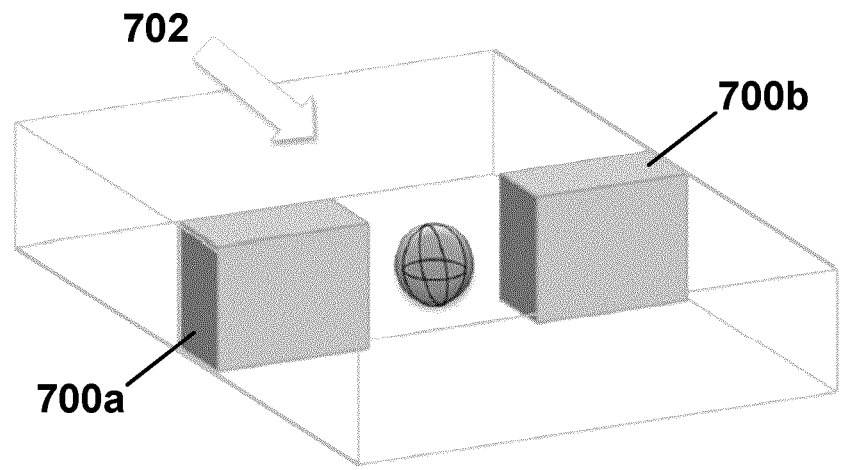
FIG. 21 is a schematic showing an example of an electrode configuration that may be used for flow detection in a microfluidics device.

Applications of such composites may include, for example, plasmonic sensor substrates, microheaters based on plasmonics, integration in microfluidic devices, electrochemical sensor substrates (such as but not limited to nanostructured 3D-electrodes or 3D-conductive imprinted hydrogel substrates for electrochemical detection of biological targets), large scale fabricated 3D metamaterials, conductive inks for printable electronics, 3D microelectrodes embedded in microchannels of microfluidic devices that can be used as electrochemical sensors (such as but not limited to impedance sensors or flow detectors), conductive 3D scaffolds for cardiac and/or neural tissue engineering, flexible films displaying plasmonic colors for security printing applications, antimicrobial hydrogels (i.e. polymer films loaded with silver nanoparticles) and conductive or flexible sensor films for wearable electronics.

a) Low-Cost Plasmonic Sensor Substrates Fabrication:

Methods for preparing a polymer film-metal composite of the present application comprising nanoimprint lithography (e.g. an embodiment of the method shown in FIG. 2 and described hereinabove) may be used, for example, to produce nanostructured plasmonic substrates rapidly and inexpensively. Such substrates may be used, for example, for surface-enhanced Raman spectroscopy (SERS), localized surface plasmon resonance (LSPR) or colorimetric assays. Alternatively, methods for preparing a polymer film-metal composite of the present application comprising deposition according to an embodiment of the method shown in FIG. 4 and described hereinabove may be used to fabricate such structures.

b) Microheaters Based on Plasmonics, Optionally Integrated in Microfluidic Devices:

Light-induced heat generation in metals may be used, for example, to control chemical reactions and thermally activated physical processes. The ability to rapidly raise and lower the temperature in nanoscale volumes of material may be used, for example, to control chemical reactions with advantageous spatial and temporal control. Metallic nanostructures may be effective, light-driven sources of heat owing to their large optical absorption cross-section. By engineering the size, shape and/or dielectric environment of metallic nanoparticles one can control their ability to absorb and scatter light. This effective heating may be used, for example, in plasmonics applications, including but not limited to selective identification and killing of cancer cells, modification of polymer surfaces, local control over phase transitions, growth of individual semiconductor nanowires and carbon nanotubes, nanofluidics and chemical separation, drug delivery and/or induced reversible photothermal melting of DNA. In many of these uses the need to heat only locally rather than globally may result in significant increases in control, speed and/or energy efficiency with an accompanying reduction in cost. Using polymer-metal composites as a substrate to fabricate microfluidic devices with an array of pillars, for example, in the schematic shown in FIG. 16 may allow, for example, the implementation of large area plasmonic heaters for various applications. Referring to FIG. 16, light irradiation 400 of the array of pillars 402 causes localized heating 404. FIG. 17 shows an example of a microfluidic plasmonic microheater device (left) using the PEDGA-Au composites (of which images are also shown in FIG. 11).

c) Nanostructured 3D Detection Electrodes for Increased Sensitivity:

Electrochemical detection is a useful candidate for rapid detection in micro total analysis systems (μ-TAS) or lab-on-chip systems due to its ease of integration. For instance, immunoassay applications have been reported and interdigitated arrayed electrodes have been investigated to improve the sensitivity of amperometric detection. However, in such systems, the redox species near the electrode surface may be trapped and participate in the electrochemical reaction which is inefficient in 2D flat electrode configurations. In order to improve the trap ratio of redox species to the electrode surface, a 3D comb electrodes system can be employed. Methods of the present application may be used to prepare such 3D electrodes. For example, they can be prepared by methods comprising NIL or photolithography. FIG. 18 is a schematic showing an example of such a 3D electrode (R=reduction; O=oxidation). Arrows show flow of species to be detected in between the two electrodes. The use of 3D electrode configuration with a nanostructured surface may, for example, increase the available active surface area, and thus the detection signals.

d) 3D Conductive Imprinted Hydrogel Substrates or Particles for Electrochemical Detection:

Because of their recognition properties, stability, reproducibility, low cost, robustness and/or manufacturing potential, molecularly imprinted polymers (MIPs) may be used for the replacement of biomolecules as the recognition element in a range of chemical sensors. Herein, the use of composites such as PEGDA-Au composites can enable simple integration of an electrochemical biosensing element and transducer in one monolythic substrate. FIG. 19 is a schematic of an example of a MIP electrochemical sensor film showing polymerization 500, extraction 502 and recognition 504. Referring to FIG. 19, the biomolecule of interest is imprinted in the hydrogel during UV exposure, which allows simultaneous creation of the metallic nanoparticles during polymerization 500 in the methods of the present application. The imprinted biomolecule of interest is subsequently removed 502 and the sensor-transducer system can be employed, for example as follows. Once the hydrogel is incubated with a sample, if the target biomolecule becomes embedded in the hydrogel film, as a result of recognition event 504, the electrical properties (e.g. impedance) of the film will change, which can be detected.

e) Large Scale Fabrication of 3D Metamaterials:

Metamaterials may be of interest, for example, due to their advantageous negative refractive index and permittivity, which may be used, for example, in invisibility cloaks, superlenses, wave filters, remote aerospace applications and/or superconductors. However, for practical applications of these physical phenomena, a large scale metamaterial including a significant number of plasmonic resonators is generally required. Optical metamaterials have been prepared using electron beam lithography nanofabrication, but their total sizes are mostly limited to the micrometer scale. Embodiments of methods of the present application which comprise photolithography using a mask with a desired geometrical design may be used in a method to fabricate 3D metamaterials on a large scale. For example, multilayer polymer-film composites such as PEGDA film-Au composites can be stacked together and patterned with photolithography.

f) Conductive Inks for Printable Electronics:

Compositions comprising a monomer such as PEGDA loaded with different cationic metal precursors (e.g. gold, silver and/or copper) may also, for example, be used for low cost printing of metallic traces. The printing of the traces may be achieved, for example, using an inkjet printer, selective microstructure guided wicking or masked irradiation of a film followed by a water bath. A variety of substrates may be used, including plastics, silicon wafers, glass and paper. While not wishing to be limited by theory, the conductivity of the printed traces may, for example, be increased by thermal treatment (thermal sintering) subsequent to irradiation.

g) 3D Microelectrodes Embedded in Microchannels of Microfluidic Devices that can be Used as Electrochemical Sensors (e.g. Impedance Sensors, Flow Detectors):

As described hereinabove, flow focusing can be used to embed conductive polymer traces within microfluidic channels. Combined with masked irradiation, the composite may be precisely patterned at selected areas of the microchannels (see, for example: FIG. 15 and discussion hereinabove). FIG. 20 is a schematic showing an example of a method wherein an oil solution (600*a*, 600*b*) and a composition comprising the monomer, cationic metal precursor and photoreducer-photoinitiator 602 are introduced into microfluidics channels and a mask 604 used to selectively pattern in a desired region of the microfluidics device. Embedding patterned electrodes within a microfluidics channel may be used for flow detection or impedance detection. FIG. 21 is a schematic showing an example of a configuration of such electrodes (700*a*, 700*b*) in a microchannel for detection of flow 702.

h) Conductive 3D Scaffolds for Cardiac and Neural Tissue Engineering:

Cardiac muscle is an electroactive tissue capable of transferring electrical signals and allowing the heart to beat. When damaged, adult heart muscle has poor capability to repair itself due to a minimal regeneration potential of cardiomyocytes. In the past decade, great interest has arisen from the possibility to regenerate lost tissue by implanting therapeutic cells, biomaterials, and cardiac patches. Selection of a scaffold with appropriate mechanical and electrical properties is needed for inducing functional cardiac tissue, in vitro or in vivo. The development of conductive materials for cardiac regeneration has generated a lot of interest in recent years. Poly(ethylene glycol) diacrylate (PEGDA) hydrogels are an example of a suitable functional biomaterial as they are intrinsically biocompatible, resist protein adsorption, do not release acidic products during their degradation and may be crosslinked with low cytotoxicity, allowing for high density three-dimensional (3-D) cell encapsulation. Furthermore, such poly(ethylene glycol) (PEG) hydrogels can be modified by crosslinking a large number of bioactive moieties (peptides, glycosaminoglycans, growth factors) to achieve a high degree of specific bioactivity. Such bioactive moieties are dispersed in the composite precursor composition prior to cross-linking. Additionally, since these materials can be rapidly photopolymerized, spatial control of functional moieties is possible in both 2D and 3D. The PEGDA-based composites that have been prepared in the studies described hereinabove may, for example, combine several properties of interest to tissue engineering, including the natural-based origin with adequate mechanical properties and electrical conduction. Since PEGDA is nonconductive, its electrical properties are improved by adding conductive material, and herein, doping with gold or silver nanoparticles is easily achieved in a single step during the fabrication (photopolymerization stage). In the field of tissue engineering, such a composite may, for example, be used as a neural stem cell scaffold as it may incorporate topographical, chemical and/or electrical cues in the same scaffold to provide an environment for neural tissue regeneration that may have advantages over conventional inert biomaterials. Suitable fabrication methods for preparing such scaffolds include, for example, a stereolithography fabrication method as reported by Cha et al., Biomaterials Science 2014, 2, 703-709 and a UV 3D printing method as reported by Chuang et al., *Biofabrication* 2012, 4, 025009 and could be adapted for the polymer film-metal composite precursor compositions of the present application.

i) Flexible Films Displaying Plasmonic Colors for Security Printing Applications:

Nano-patterned ultrathin metal films have been used as plasmonic subtractive color filter arrays with sub-micrometer spatial resolution. This represents an attractive approach for on-chip color filters, which may be useful components for future displays, image sensors, digital photography, projectors and other optical measurement instrumentation. Previous approaches based on traditional colorant filters employ organic dyes or chemical pigments that are vulnerable to processing chemicals, and undergo performance degradation under long-duration ultraviolet irradiation or at high temperatures. In the studies described hereinabove, a PEGDA-gold composite film was nanostructured using a UV-NIL (ultraviolet-nanolithography imprint) process to fabricate 700 nm pitch blazed gratings. The gratings exhibited intense red, green and blue colors enabled by diffraction and plasmonic phenomena.

j) Antimicrobial Hydrogels (Polymer Films Loaded with Silver Nanoparticles):

The increasing prevalence of microbial infections, especially those associated with impaired wound healing and biomedical implant failure has spurred the development of new materials having antimicrobial activity. Hydrogels are a class of highly hydrated material finding use in diverse medical applications such as drug delivery, tissue engineering, as wound fillers and as implant coatings, to name a few. The biocompatible nature of many hydrogels make them a convenient starting platform to develop selectively active antimicrobial materials. Hydrogels with antimicrobial properties have been obtained through the encapsulation or covalent immobilization of known antimicrobial agents. Silver nanoparticles (NPs) may, for example, be used in biomedical applications given their known antimicrobial properties against a broad range of bacteria and fungi; see, e.g. Veiga et al., *Biopolymers* 2013, 100(6), 637-644 reporting studies with *E. coli*. Accordingly, PEGDA with embedded silver nanoparticles may, for example, serve as an antimicrobial hydrogel for use as wound dressings and fillers. Advantages of the fabrication method of the present application, wherein silver nitrate is directly reduced within a gel network during polymerization stage, in comparison with standard silver NP encapsulation techniques may include simplicity and/or reduced cost and/or production time.

While the present application has been described with reference to what are presently considered to be the preferred examples, it is to be understood that the application is not limited to the disclosed examples. To the contrary, the present application is intended to cover various modifications and equivalent arrangements included within the spirit and scope of the appended claims.

All publications, patents and patent applications are herein incorporated by reference in their entirety to the same extent as if each individual publication, patent or patent application was specifically and individually indicated to be incorporated by reference in its entirety. Where a term in the present application is found to be defined differently in a document incorporated herein by reference, the definition provided herein is to serve as the definition for the term.

FULL CITATIONS FOR DOCUMENTS REFERRED TO IN THE DESCRIPTION

[1] Tyagi, M., Suri, G., Chhabra, P., Seshadri, G., Malik, A., Aggarwal, S., and Khandal, R. K. "Novel way of making high refractive index plastics; metal containing polymers for optical applications" e-Polymers 2009, 9:1, 1197-1214.

[2] Ghosh, K., and S. N. Maiti. "Mechanical properties of silver-powder-filled polypropylene composites" J. Appl. Polym. Sci. 1996, 60:3, 323-331.

[3] Khosla, A., "Nanoparticle-doped electrically-conducting polymers for flexible nanomicro systems" Electrochemical Society Interface 2012, 21:3-4, 67-70.

[4] O. M. Folarin, E. R. Sadiku, and A. Maity, "Polymer-noble metal nanocomposites: review" Int. J. Phys. Sci. 2011, 6:21, 4869-4882.

[5] RangaReddy, P., K. MohanaRaju, and N. SubbaramiReddy, "A Review on polymer nanocomposites: Monometallic and bimetallic nanoparticles for biomedical, optical and engineering applications" 2013, Chem Sci Rev Lett 1:4, 228-235.

[6] Yagci, Y., M. Sangermano, and G. Rizza, "In situ synthesis of gold crosslinked poly (ethylene glycol) nanocomposites by photoinduced electron transfer and free radical polymerization processes" Chem. Commun. 2008, 24, 2771-2773.

[7] Yagci, Y., M. Sangermano, and G. Rizza, "Synthesis and characterization of gold-epoxy nanocomposites by visible light photoinduced electron transfer and cationic polymerization processes." Macromolecules 2008, 41:20, 7268-7270.

The invention claimed is:

1. A method for preparing a polymer film-metal composite, the method comprising:
    depositing on a surface, a composition comprising:
        a cationic metal precursor;
        a polymer film precursor that comprises a plurality of photopolymerizable groups; and
        a photoreducer-photoinitiator; and
    irradiating the composition under conditions to simultaneously reduce the cationic metal precursor and polymerize the photopolymerizable groups to obtain the polymer film-metal composite on the surface,
    wherein the polymer film-metal composite comprises metal nanoparticles embedded in the polymer film precursor,
    wherein the composition further comprises an agent that caps and/or stabilizes the nanoparticles, and
    wherein the polymer film precursor is obtained from a method comprising: reacting a monomer comprising two or more photopolymerizable groups with an anchor precursor comprising at least one metal-anchoring group and at least one group that will react with the photopolymerizable groups.

2. The method of claim 1, wherein the irradiating comprises flood exposure of the composition deposited on the surface.

3. The method of claim 1, wherein the method further comprises removing the composite from the surface to obtain a composite that has the negative of the surface pattern template thereon.

4. The method of claim 1, wherein the irradiating comprises exposure of the composition deposited on the surface through a mask defining a pattern.

5. The method of claim 4, further comprising removing the unexposed composition under conditions to leave the composite on the surface.

6. The method of claim 1, wherein the surface is the inside of a hollow cavity.

7. The method of claim 1, wherein the polymer film precursor further comprises a plurality of metal-anchoring groups.

8. The method of claim 1, wherein the cationic metal precursor is a cationic gold precursor, a cationic silver precursor, a cationic copper precursor or combinations thereof.

9. The method of claim 1, wherein the photopolymerizable groups are acrylate groups.

10. The method of claim 1, wherein an aqueous solution of the monomer is reacted with an aqueous solution of the anchor precursor.

11. The method of claim 1, wherein the at least one metal-anchoring group and the at least one group that will react with the photopolymerizable groups are the same and the anchor precursor is a bi-functional thiol, bi-functional primary amine or bi-functional silane.

12. The method of claim 11, wherein the anchor precursor is dithiothreitol.

13. The method of claim 1, wherein the monomer further comprises an oligomeric poly(ethylene glycol).

14. The method of claim 13, wherein the monomer is poly(ethylene glycol)-diacrylate (PEGDA) or ethoxylated trimethylolpropane triacrylate (ETPTA).

15. The method of claim 14, wherein the monomer is PEGDA.

16. A polymer film-metal nanoparticle composite comprising a uniform distribution of metal nanoparticles embedded in a polymeric resin film, the polymeric resin film comprising a plurality of metal-anchoring groups, the metal-anchoring groups anchored to the nanoparticles, wherein the metal-anchoring groups are derived from dithiothreitol.

17. The polymer film-metal nanoparticle composite of claim 16, wherein the metal nanoparticle is a gold nanoparticle, a silver nanoparticle, or a copper nanoparticle, or combinations thereof.

18. The polymer film-metal nanoparticle composite of claim 16, wherein the polymeric resin film is an acrylate resin film, an epoxy resin film, a siloxane resin film, or combinations thereof.

19. The polymer film-metal nanoparticle composite of claim 18, wherein the polymeric resin film further comprises an oligomeric poly(ethylene glycol).

20. The polymer film-metal nanoparticle composite of claim 16, wherein the polymeric resin film is a poly(ethylene glycol)-diacrylate resin or an ethoxylated trimethylpropane triacrylate (ETPTA) resin.

* * * * *